US012216345B2

(12) United States Patent
Wei et al.

(10) Patent No.: US 12,216,345 B2
(45) Date of Patent: Feb. 4, 2025

(54) DISPLAY PANEL AND DISPLAY APPARATUS

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventors: Qibing Wei, Wuhan (CN); Bing Han, Wuhan (CN); Yuying Cai, Wuhan (CN); Peng Zhang, Wuhan (CN); Kang Yang, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/832,927

(22) Filed: Jun. 6, 2022

(65) Prior Publication Data

US 2022/0299815 A1 Sep. 22, 2022

(30) Foreign Application Priority Data

Dec. 31, 2021 (CN) .......................... 202111658140.4

(51) Int. Cl.
*G02F 1/1333* (2006.01)
*H10K 50/842* (2023.01)
*H10K 59/122* (2023.01)

(52) U.S. Cl.
CPC ... *G02F 1/133308* (2013.01); *H10K 50/8426* (2023.02); *H10K 59/122* (2023.02); *G02F 2202/28* (2013.01)

(58) Field of Classification Search
CPC .......... G02F 1/133308; G02F 2202/28; G02F 1/13394; H10K 50/8426; H10K 50/84; H10K 59/122; H10K 59/12
See application file for complete search history.

(56) References Cited

U.S. PATENT DOCUMENTS 7,705,957 B2 * 4/2010 Whitehead, Jr. ...... G02F 1/1341
349/190
2003/0025868 A1 * 2/2003 Hiroshima .......... G02F 1/13394
349/156

(Continued)

FOREIGN PATENT DOCUMENTS

| CN | 106054465 A | 10/2016 |
| CN | 111474772 A | 7/2020 |
| CN | 111863890 A | 10/2020 |

OTHER PUBLICATIONS

First Chinese Office Action mailed on Aug. 23, 2023, issued in the corresponding Chinese Application No. 2021116581404, filed on Dec. 31, 2021, 9 pages.

*Primary Examiner* — Paisley L Wilson
*Assistant Examiner* — Agnes Dobrowolski
(74) *Attorney, Agent, or Firm* — Christensen O'Connor Johnson Kindness PLLC

(57) ABSTRACT

A display panel and a display apparatus are described. In an embodiment, the display panel includes a display area and a bezel area; a first support structure located in the display area, the first support structure including a plurality of first support portions; an encapsulation adhesive located in the bezel area; a second support structure located in the bezel area. In an embodiment, at different positions of the bezel area, the second support structure and the encapsulation adhesive are at an equal distance from each other within a preset error range; the second support structure includes at least one second support portion; and in a direction perpen- (Continued)

dicular to a plane in which the display panel is located, at least some of the second support portions each has orthographic projection area larger than orthographic projection area of the first support portion.

18 Claims, 18 Drawing Sheets

(56) References Cited

U.S. PATENT DOCUMENTS

| | | | | |
|---|---|---|---|---|
| 2005/0106768 | A1* | 5/2005 | Onozuka | H01L 27/146 |
| | | | | 438/30 |
| 2005/0219456 | A1* | 10/2005 | Tadaki | G02F 1/1339 |
| | | | | 349/156 |
| 2010/0033669 | A1* | 2/2010 | Iizawa | G02F 1/13394 |
| | | | | 349/187 |
| 2012/0194494 | A1* | 8/2012 | Jung | G02F 1/1341 |
| | | | | 349/123 |
| 2015/0041772 | A1* | 2/2015 | Han | H10K 59/122 |
| | | | | 438/23 |
| 2017/0248817 | A1* | 8/2017 | Lee | G02F 1/133351 |
| 2019/0326376 | A1* | 10/2019 | Huo | H10K 59/1201 |
| 2021/0135147 | A1* | 5/2021 | Wang | H10K 50/841 |
| 2021/0142722 | A1* | 5/2021 | Yan | H10K 59/122 |

* cited by examiner

DISPLAY PANEL AND DISPLAY APPARATUS

CROSS REFERENCE TO RELATED APPLICATIONS

The present application claims to the benefit of Chinese Patent Application No. CN 202111658140.4, filed on Dec. 31, 2021, the content of which is incorporated herein by reference in its entirety.

TECHNICAL FIELD

The present disclosure relates to the technical field of display, and in particular, to a display panel and a display apparatus.

BACKGROUND

A display panel includes a first substrate and a second substrate arranged opposite to each other. An encapsulation adhesive and a support column are disposed between the first substrate and the second substrate. The encapsulation adhesive is used to fix the first substrate and the second substrate in an encapsulation process such that first substrate and the second substrate form a cell, and the support column is used to support the second substrate to form a uniform cell thickness.

However, in the prior art, the support column is easily crushed during the encapsulation process, which has a negative impact on display.

SUMMARY

Accordingly, embodiments of the present disclosure provide a display panel and a display apparatus, to reduce the risk of crushing a support column.

In one aspect, the present disclosure provides a display panel. In an embodiment, the display panel includes a display area and a bezel area; a first support structure located in the display area, the first support structure including a plurality of first support portions; an encapsulation adhesive located in the bezel area, the encapsulation adhesive extending along an edge of the display area; and a second support structure located in the bezel area, the second support structure extending along the edge of the display area and being located on a side of the encapsulation adhesive that faces towards the display area; wherein, at different positions of the bezel area, the second support structure and the encapsulation adhesive are at an equal distance from each other within a preset error range; the second support structure includes at least one second support portion; and in a direction perpendicular to a plane in which the display panel is located, at least some of the second support portions each has an orthographic projection area larger than an orthographic projection area of the first support portion.

According to another aspect, the present disclosure provides a display apparatus, including the foregoing display panel.

BRIEF DESCRIPTION OF THE DRAWINGS

To describe the technical solutions in the embodiments of the present disclosure more clearly, the following briefly describes the accompanying drawings required to be used in the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For the sake of a better understanding of the technical solutions of the present disclosure, the embodiments of the present disclosure are described in detail below with reference to the accompanying drawings.

It should be noted that the embodiments in the following descriptions are only a part rather than all of the embodiments in the present disclosure. All other embodiments obtained by those ordinarily skilled in the art based on the embodiments of the present disclosure without creative efforts should also fall within the protection scope of the present disclosure.

Terms in the embodiments of the present disclosure are merely used to describe the specific embodiments, and are not intended to limit the present disclosure. Unless otherwise specified in the context, words, such as "a", "the", and "this", in a singular form in the embodiments of the present disclosure and the appended claims include plural forms.

It should be understood that the term "and/or" in this specification merely describes associations between associated objects, and it indicates three types of relationships. For example, A and/or B may indicate that A exists alone, A and B coexist, or B exists alone. In addition, the character "/" in this specification generally indicates that the associated objects are in an "or" relationship.

Figure 1:
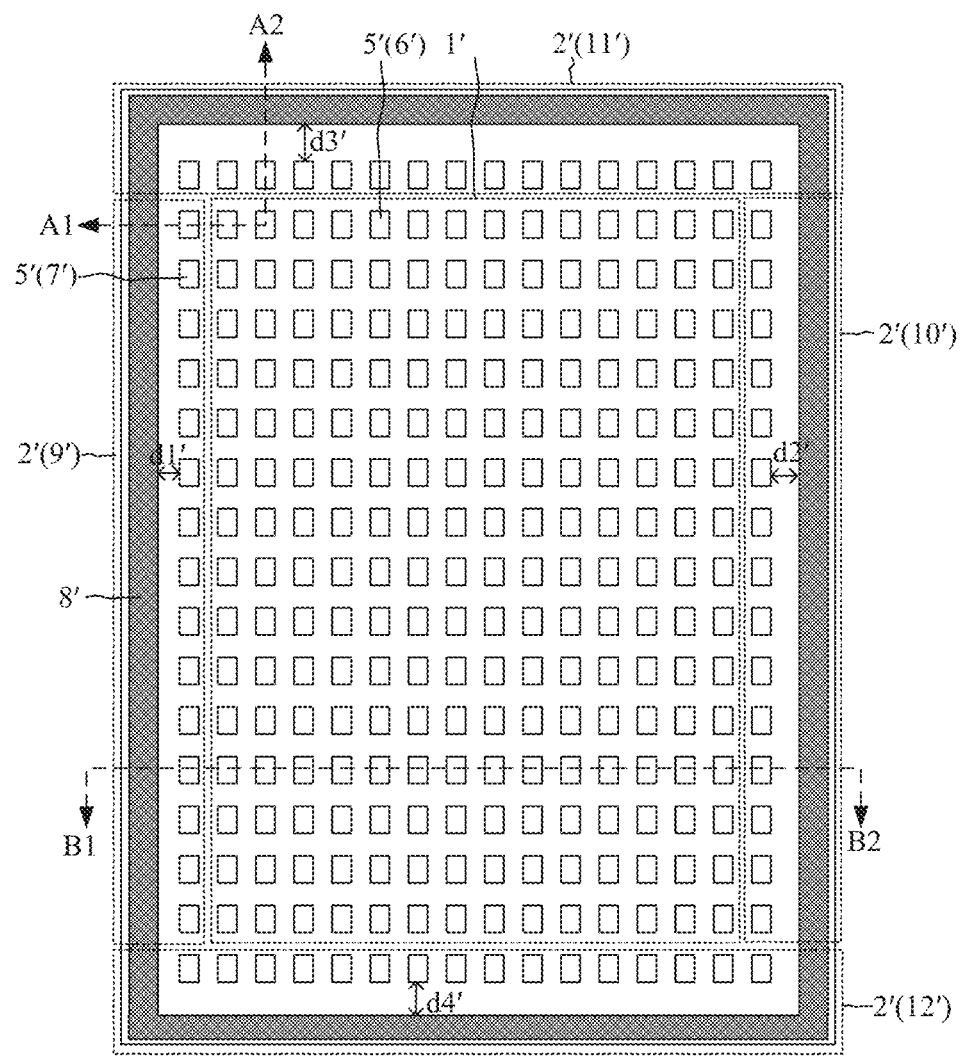
FIG. 1 is a schematic structural diagram of a display panel in the prior art.
Figure 2:
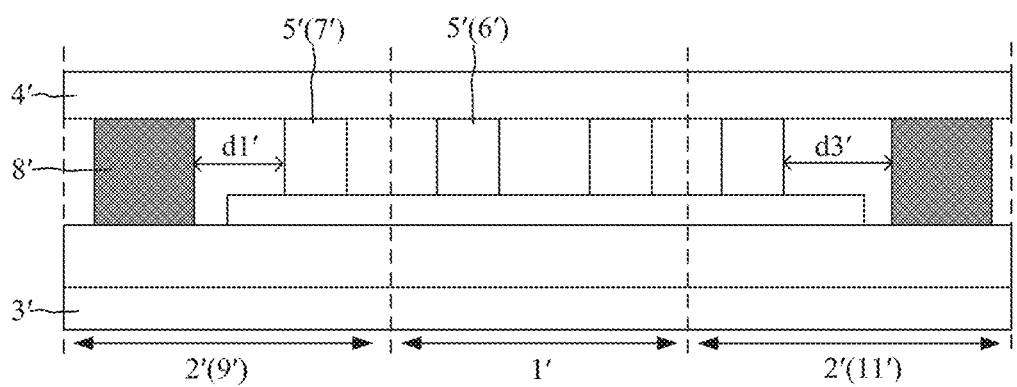
FIG. 2 is a cross-sectional view the display panel of FIG. 1 along a direction A1-A2.
Figure 3:
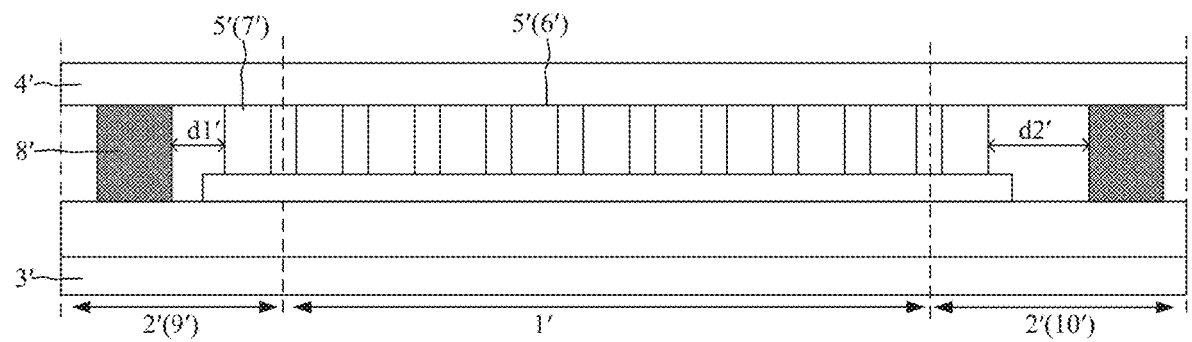
FIG. 3 is a cross-sectional view of the display panel of FIG. 1 along a direction B1-B2.

Before illustration of the technical solutions provided by the embodiments of the present disclosure, the problems in the prior art are first described in the present disclosure:

FIG. 1 is a schematic structural diagram of a display panel in the prior art; FIG. 2 is a cross-sectional view of the display panel of FIG. 1 along a direction A1-A2; FIG. 3 is a cross-sectional view of the display panel of FIG. 1 along a direction B1-B2. As shown in FIG. 1 to FIG. 3, the display panel includes a display area 1' and a bezel area 2', wherein display functional devices for displaying pictures are disposed in the display area 1', and peripheral circuits and peripheral lines for providing driving signals to the display functional devices are disposed in the bezel area 2'.

The display panel further includes a first substrate 3' and a second substrate 4' that are disposed opposite to each other; an encapsulation adhesive 8' and support columns 5' are disposed between the first substrate 3' and the second substrate 4'. The encapsulation adhesive 8' is located in the bezel area 2'. During encapsulation of the display panel, laser sintering is performed on the encapsulation adhesive 8', to fix the second substrate 4' and the first substrate 3' by using the encapsulation adhesive 8'. The support columns 5' are used for supporting the second substrate 4', to form a uniform thickness.

In the prior art, when the support columns 5' are formed, in addition to first support columns 6' formed in the display area 1', several cycles of support columns 5' are further expanded to the bezel area 2' to form second support columns 7' in the bezel area 2', to improve the support performance of the bezel area 2'. FIG. 1 shows an example of expanding one circle of second support columns 7'. Moreover, the second support column 7' has the same size as the first support column 6'.

At present, different side bezels of a display panel generally have different bezel widths in a practical product structure.

For example, referring to FIG. 1 again, the bezel area 2' includes a left bezel 9', a right bezel 10', an upper bezel 11' and a lower bezel 12', wherein the left bezel 9' and the right bezel 10' are located on two opposite sides of the display area 1' in a row direction; the upper bezel 11' and the lower bezel 12' are located on two opposite sides of the display area 1' in a column direction.

In the existing panel structure, it is more likely to design the left bezel 9' and the right bezel 10' to be ultra-narrow bezels. Therefore, in the prior art, the bezel widths of the left bezel 9' and the right bezel 10' of the display panel are obviously less than the bezel widths of the upper bezel 11' and the lower bezel 12'. The left bezel 9' and the right bezel 10' are used for accommodating peripheral circuits that provide driving signals, e.g., shift register circuits. Circuit types and quantities of peripheral circuits to be disposed in the two bezels are different. Therefore, in the prior art, it is necessary to design asymmetrical bezel widths of the left bezel 9' and the right bezel 10'.

Because different side bezels of the display panel have different bezel widths, after the second support columns 7' are expanded in the bezel area 2', second support columns 7' in different side bezels have different distances to the encapsulation adhesive 8'. With reference to FIG. 1 to FIG. 3, a distance d3' from the second support column 7' in the upper bezel 11' to the encapsulation adhesive 8' and a distance d4' from the second support column 7' in the lower bezel 12' to the encapsulation adhesive 8' are obviously greater than a distance d1' from the second support column 7' in the left bezel 9' to the encapsulation adhesive 8' and a distance d2' from the second support column 7' in the right bezel 10' to the encapsulation adhesive 8'. Moreover, the distance d1' from the second support column 7' in the left bezel 9' to the encapsulation adhesive 8' is also different from the distance d2' from the second support column 7' in the right bezel 10' to the encapsulation adhesive 8'.

It can be understood that, when laser sintering is performed on the encapsulation adhesive 8' to fix the two substrates, the second substrate 4' will inevitably exert a downward pressure to the first substrate 3'. A larger force is exerted by the second substrate 4' at a position closer to the encapsulation adhesive 8', and accordingly, the second support column 7' receives a larger force. Because the second support columns 7' in different side bezels have different distances to the encapsulation adhesive 8', the forces on the second support columns 7' in different side bezels are uneven. As a result, the second support columns 7' are easily crushed.

If the second support columns 7' are crushed, the support strength of the second support columns 7' decreases. In this case, the deformation resistance of the display panel is deteriorated, and second substrate 4', when being pressed down, may further crush the first support columns 6' in the display area 1' which are close to the encapsulation adhesive 8', which undoubtedly aggravates the non-uniformity of the cell thickness and affects the display performance, for example, Newton's rings are produced. Especially, a display panel with a narrow-bezel design has a limited bezel width, and only one or two cycles of second support columns 7' may be expanded in the bezel area 2; after the second support columns 7' are crushed, the first support columns 6' also have a higher risk of being crushed, which deteriorates the display effect.

In addition, during design of the size of the support column 5', since the first support column 6' is not allowed to shield normal light emitting of the display panel, the first support column 6' needs to have a relatively small size. In the prior art, the support columns 5' in the entire display panel are designed with the same size. Therefore, the second support column 7' also has a relatively small size, resulting in a small, stressed area and low support strength of the second support column 7'. The second support column 7' is more easily crushed when being pressed.

Figure 4:
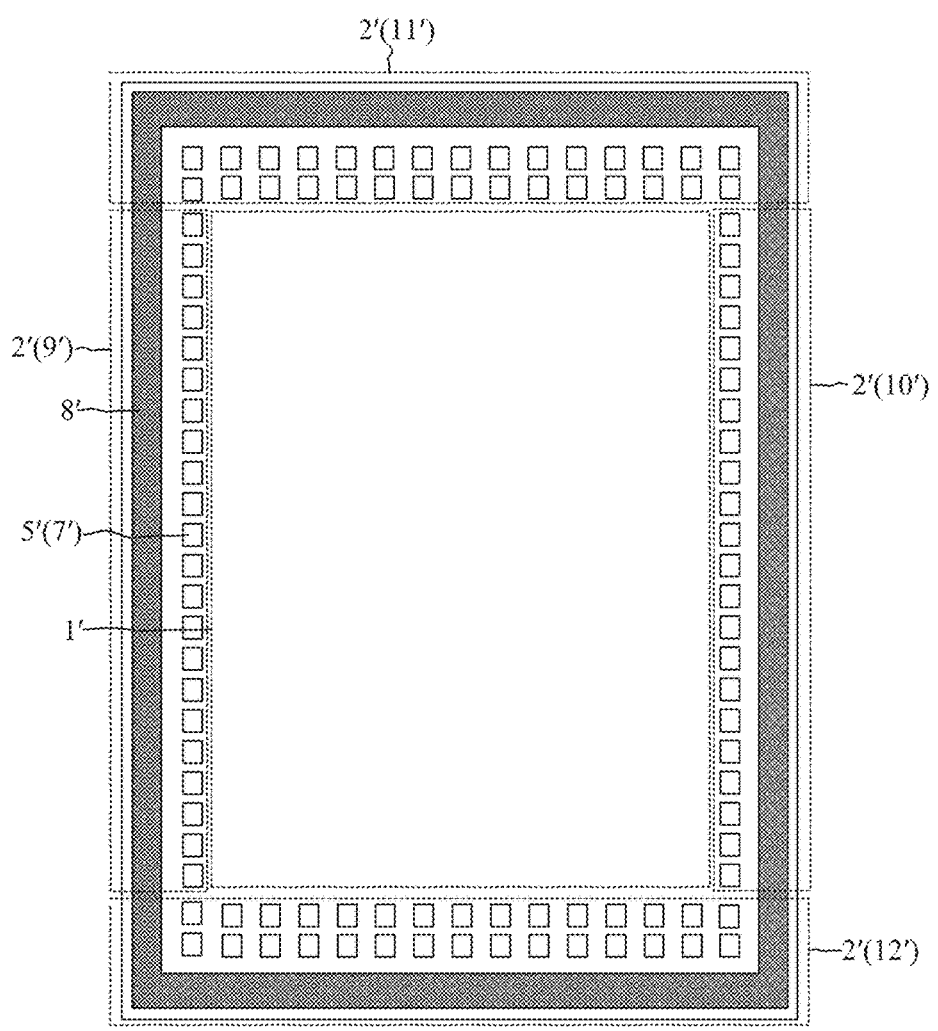
FIG. 4 is a schematic structural diagram of a display panel according to an embodiment of the present disclosure.

Accordingly, the present disclosure provides a structure, as shown in FIG. 4, which is a schematic structural diagram of a display panel according to an embodiment of the present disclosure. In this structure, the number of rows of expanded second support columns 7' in different side bezels can be adaptively adjusted according to the bezel widths of different side bezels.

For example, in the upper bezel 11' and the lower bezel 12' with relatively large bezel widths, more rows of second support columns 7' may be expanded, while in the left bezel 9' and the right bezel 10' with relatively small bezel widths, fewer rows of second support columns 7' are expanded. Alternatively, for the left bezel 9' and the right bezel 10' with asymmetrical bezel widths, the second support columns 7' may be expanded by different rows in the two bezels.

In existing display panels, the bezel width of each bezel and the design size of the support column 5' do not necessarily satisfy a certain proportional relation. By merely adjusting the number of rows of expanded second support columns 7' in different side bezels, the support stability of the second support columns 7' in some bezels (such as the upper bezel 11' and the lower bezel 12') can be improved, but the problem of different distances from the second support columns 7' in different side bezels to the encapsulation adhesive 8' cannot be solved.

For example, even if the number of rows of expanded second support columns 7' in the upper bezel 11' is increased, but it is still impossible to make the distance from the second support column 7' in the upper bezel 11' to the encapsulation adhesive 8' equal to the distances from the second support columns 7' in the left and right bezels to the encapsulation adhesive 8'. Or, even if the numbers of rows of expanded second support columns 7' in the left bezel 9' and the right bezel 10' is adjusted, it is still impossible to make the distances from the second support columns 7' in the left and right bezels to the encapsulation adhesive 8' equal.

Accordingly, the present disclosure shows that the two structures. In the first structure, two rows of second support columns 7' are expanded at the lower bezel 12' of the display panel, and one row of second support columns 7' are expanded in other bezels; in the second structure, three rows of second support columns 7' are expanded at the lower bezel 12' of the display panel, and two rows of second support columns 7' are expanded in other bezels. Upon testing, it is found that Newton's rings visual effects of the two structures are not significantly different, which indicates that compared with the first structure, the second structure, even with the number of rows of expanded second support columns 7' being adjusted, cannot alleviate the problem of poor display effect caused by unevenly distributed forces on the second support columns 7'.

Particularly, for display products such as a mobile phone, the display panel of such a display product is generally in the shape of a rectangle or a rectangle with rounded corners, and the lengths of different side bezels in such a display panel are greatly different, wherein the lengths of the left and right bezels are obviously greater than the lengths of the upper and lower bezels. Therefore, the problem of unevenly distributed forces on the second support columns 7' is more severe in such display panels.

Accordingly, the present disclosure provides a display panel suitable to address and alleviate the problem of unevenly distributed forces on the second support columns in different side bezels.

Figure 5:
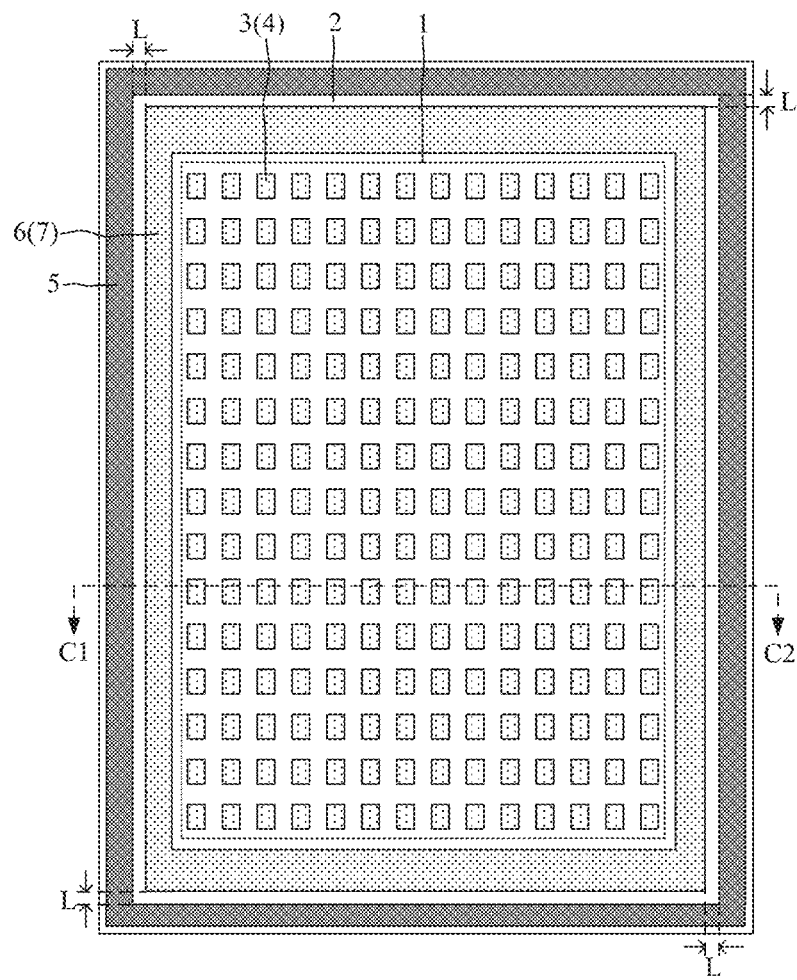
FIG. 5 is another schematic structural diagram of a display panel according to an embodiment of the present disclosure.
Figure 6:
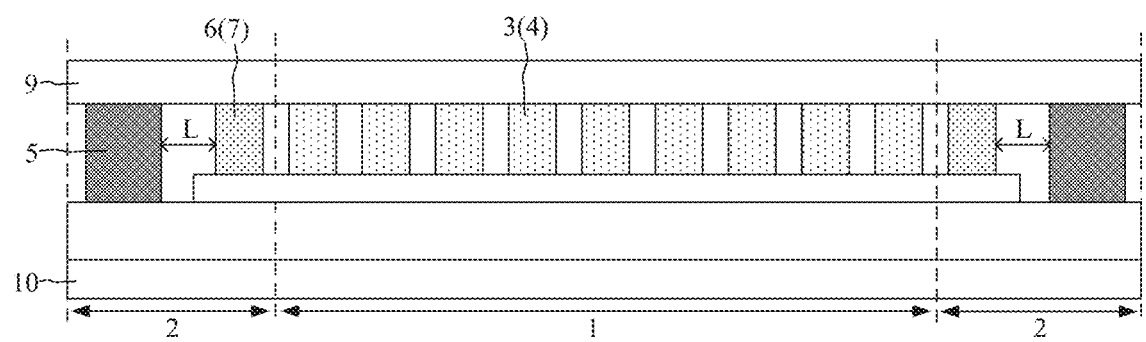
FIG. 6 is a cross-sectional view of the display panel of FIG. 5 along a direction C1-C2.

FIG. 5 is another schematic structural diagram of a display panel according to an embodiment of the present disclosure, and FIG. 6 is a cross-sectional view of FIG. 5 along a direction C1-C2. As shown in FIG. 5 and FIG. 6, the display panel includes a display area 1 and a bezel area 2. The display panel further includes: a first support structure 3 located in the display area 1, the first support structure 3 including a plurality of first support portions 4; an encapsulation adhesive 5 located in the bezel area 2, wherein the encapsulation adhesive 5 extends along an edge of the display area 1, and the encapsulation adhesive 5 in the embodiments of the present disclosure may be Frit, which contains a laser absorption pigment and is melt after absorbing laser, thereby achieving a good bonding effect and desirable sealing effect; a second support structure 6 located in the bezel area 2, the second support structure 6 extending along the edge of the display area 1 and being located on a side of the encapsulation adhesive 5 that faces towards the display area 1.

At different positions of the bezel area 2, the second support structure 6 and the encapsulation adhesive 5 are at an equal distance from each other within a preset error range; moreover, the second support structure 6 includes at least one second support portion 7. In a direction perpendicular to a plane in which the display panel is located, at least some of the second support portions 7 each has an orthographic projection area larger than an orthographic projection area of the first support portion 4.

It should be noted that, the support structure in the display panel is generally formed by etching an organic film. Depending on the etching precision, an actual forming position of the support structure may have some deviations. The foregoing expression that "the second support structure 6 and the encapsulation adhesive 5 are at an equal distance from each other within the preset error range" means that the two are at an equal distance from each other within a machining error range. For example, the preset error range may be less than or equal to 5 μm. Definitely, with high machining precision, the second support structure 6 and the encapsulation adhesive 5 may be directly at an equal distance from each other at different positions of the bezel area 2.

When laser sintering is performed on the encapsulation adhesive 5, the encapsulation adhesive 5 is melted, causing the second substrate 9 on the upper side to exert a downward pressure on the first substrate 10 on the lower side. In the embodiments of the present disclosure, the second support structure 6 and the encapsulation adhesive 5 are set to be at an equal distance from each other at different bezel positions, so that the second support structure 6 is under the same stress condition at any position, to improve the stress uniformity of the second support structure 6 at different positions, thereby effectively reducing the risk of crushing the second support structure 6 in an encapsulation process.

Moreover, compared with the first support portion 4, the second support portion 7 in the second support structure 6 has an increased design size in the embodiments of the present disclosure, so that the second support portion 7 has a larger stressed area, and when the second substrate 9 exerts a downward pressure, the bearing capacity of the second support portion 7 can be improved, to further avoid the second support structure 6 from being crushed.

In the embodiments of the present disclosure, the second support structure 6 has higher support stability, and the display panel has higher resistance to deformation, which can prevent the first support portions 4 in the display area 1 which are close to the encapsulation adhesive 5 from being crushed when the second substrate 9 exerts a downward pressure, so that the first support portions 4 also have high support stability, thereby improving cell thickness uniformity of the display panel and enhancing display performance.

It should be noted that, in the embodiments of the present disclosure, the design size of the second support portion 7 is no longer restricted by the design size of the first support portion 4. Therefore, the size of the second support portion 7 can better fit the bezel width at the position where it is located. For example, for the upper bezel and the lower bezel with relatively large bezel widths, the second support portions 7 in part of the bezels can be designed to be relatively large, so that the distance from the second support portion 7 in the lower bezel to the encapsulation adhesive 5 is equal to the distances from the second support portions 7 in the left and right bezels to the encapsulation adhesive 5. Alternatively, for the left bezel and right bezel with asymmetrical bezel widths, the second support portion 7 in the two bezels may be designed to have different sizes, so that the distances from the second support portions 7 in the left and right bezels to the encapsulation adhesive 5 are equal.

In an implementation, referring to FIG. 5 again, the distance between the second support structure 6 and the encapsulation adhesive 5 is L, wherein L≤75 μm.

It may be understood that, when laser sintering is performed on the encapsulation adhesive 5, the second substrate 9 exerts a larger downward pressure at a position closer to the encapsulation adhesive 5, and the display panel is deformed more severely. In the embodiments of the present disclosure, by setting L to be less than or equal to 75 μm, the distance between the second support structure 6 and the encapsulation adhesive 5 is very small. In this case, the second support structure 6 is closer to the encapsulation adhesive 5, to provide a more stable support for the cell thickness near the encapsulation adhesive 5. This can further improve the uniformity of cell thickness between positions near the encapsulation adhesive 5 and other positions while improving the stress uniformity of the second support columns at different bezel positions, thereby improving the overall cell thickness of the display panel.

Figure 7:
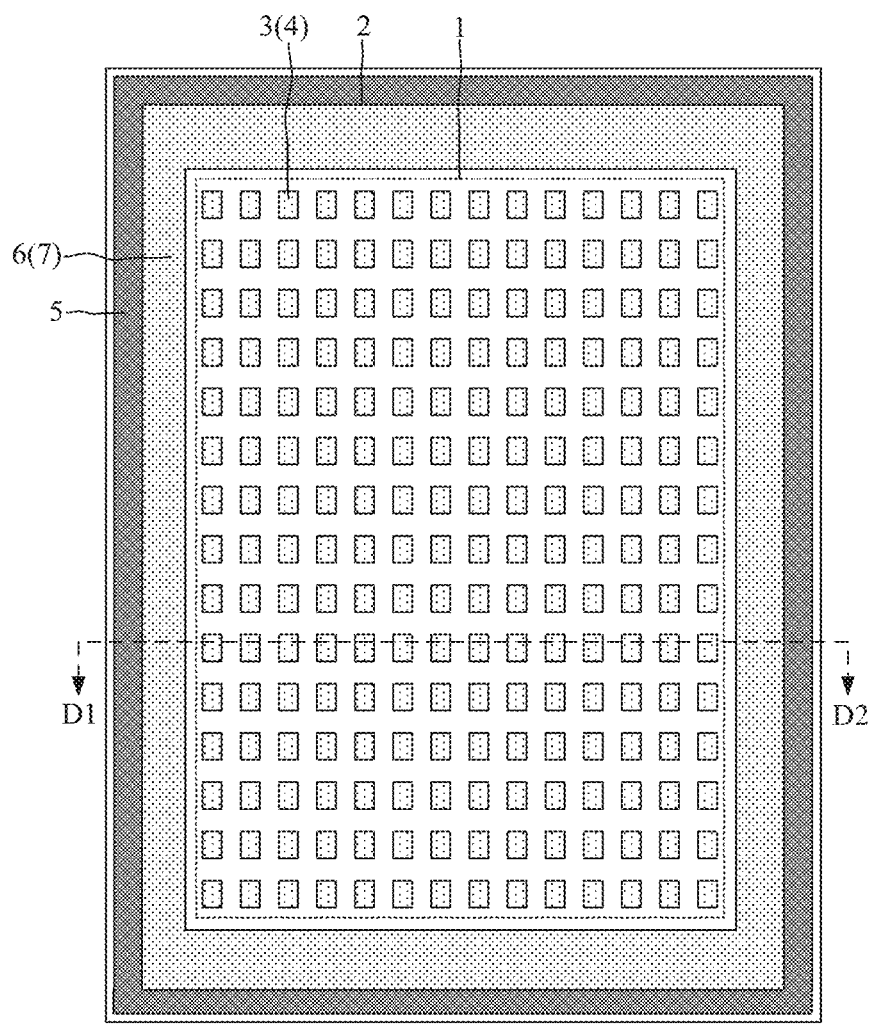
FIG. 7 is further another schematic structural diagram of a display panel according to an embodiment of the present disclosure.
Figure 8:
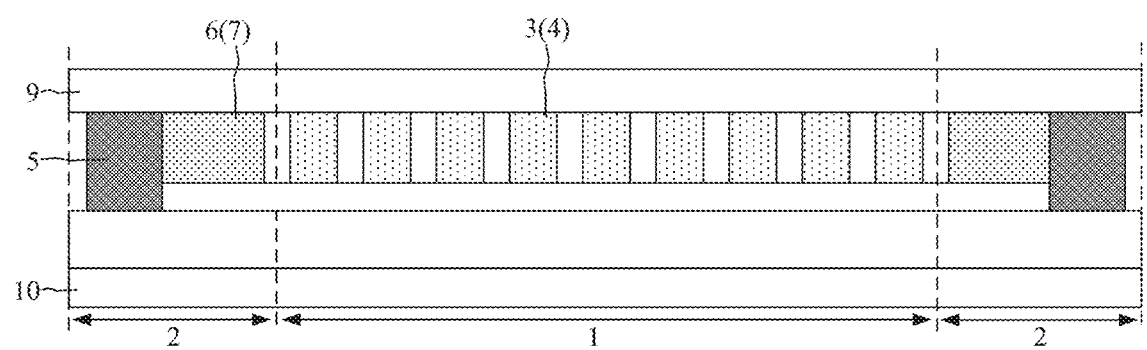
FIG. 8 is a cross-sectional view of the display panel of FIG. 7 along a direction D1-D2.

Further, FIG. 7 is further another schematic structural diagram of a display panel according to an embodiment of the present disclosure; FIG. 8 is a cross-sectional view of FIG. 7 along a direction D1-D2. As shown in FIG. 7 and FIG. 8, the second support structure 6 may be in contact with the encapsulation adhesive 5. In other words, a sidewall of the second support structure 6 that is away from the display area 1 is in contact with a sidewall of the encapsulation adhesive 5 that faces towards the display area 1. In this case, the distance between the second support structure 6 and the encapsulation adhesive 5 is zero, and the second support structure 6 provides higher support strength near the encapsulation adhesive 5.

In an implementation, referring to FIG. 1 again, at different positions of the bezel areas 2, orthographic projection of the second support structure 6 in the direction perpendicular to the plane in which the display panel is located and the display area 1 are at an equal distance from each other within a preset error range.

As described above, the expression that "the orthographic projection of the second support structure 6 and the display area 1 are at an equal distance from each other within a preset error range" means that the two are at an equal distance within a machining error range. For example, the preset error range may be less than or equal to 5 μm. Definitely, with high machining precision, the orthographic projection of the second support structure 6 and the display area 1 may be directly at an equal distance from each other at different positions of the bezel area 2.

At different bezel positions, the second support structure 6 and the display area 1 are further made to be at equal distances from each other, which can improve the stress uniformity of the second support structure 6 near the display area 1. When laser sintering is performed on the encapsulation adhesive 5, the second support structure 6 can better bear the pressure near the display area 1, to reduce the risk of crushing the second support structure 6 near the display area 1 due to uneven stress distribution, so that the second support structure 6 provides a more stable support near the display area 1, thereby further reducing the risk of crushing the first support portions 4 in the display area 1 which are close to the encapsulation adhesive 5.

Figure 9:
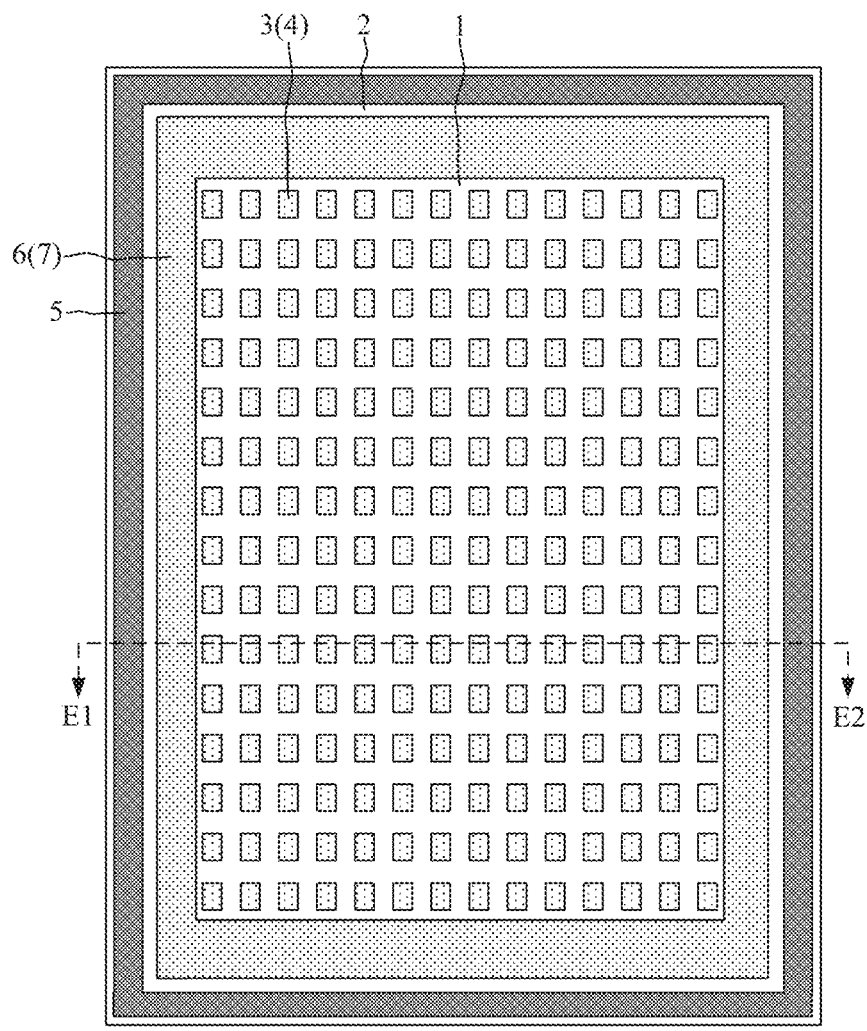
FIG. 9 is still another schematic structural diagram of a display panel according to an embodiment of the present disclosure.
Figure 10:
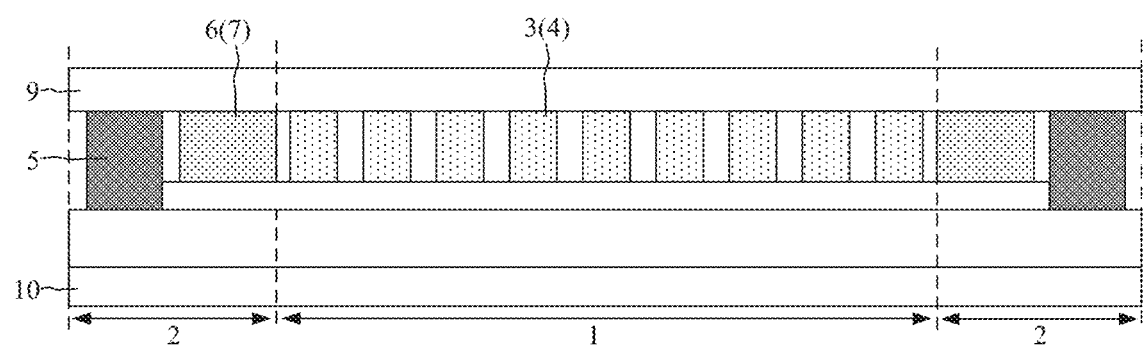
FIG. 10 is a cross-sectional view of the display panel of FIG. 9 along a direction E1-E2.

Further, FIG. 9 is still another schematic structural diagram of a display panel according to an embodiment of the present disclosure; FIG. 10 is a cross-sectional view of the display panel of FIG. 9 along a direction E1-E2. As shown in FIG. 9 and FIG. 10, in the direction perpendicular to the plane in which the display panel is located, an edge of the orthographic projection of the second support structure 6 coincides with the edge of the display area 1. In other words, orthographic projection of the sidewall, which is close to the display area 1, of the second support structure 6 is located at the edge of the display area 1. In this case, the distance between the second support structure 6 and the display area 1 is zero, and the second support structure 6 provides higher support strength near the display area 1.

Figure 11:
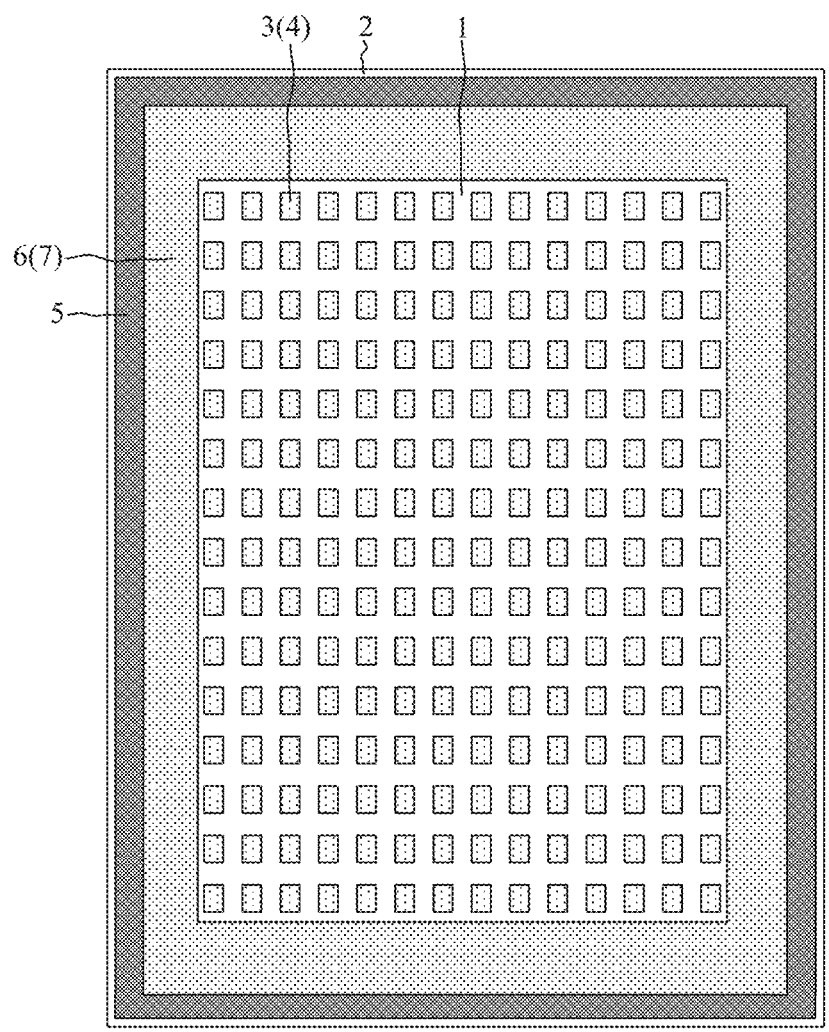
FIG. 11 is still another schematic structural diagram of a display panel according to an embodiment of the present disclosure.

It should be noted that, in other optional embodiments of the present disclosure, FIG. 11 is still another schematic structural diagram of a display panel according to an embodiment of the present disclosure. As shown in FIG. 11, the second support structure 6 is in contact with the encapsulation adhesive 5; moreover, in the direction perpendicular to the plane in which the display panel is located, the edge of the orthographic projection of the second support structure 6 further coincides with the edge of the display area 1. In this way, the area between the encapsulation adhesive 5 and the display area 1 is completely filled by the second support structure 6; the second support structure 6 has a larger stressed area, and can better bear the pressure caused by encapsulation.

Figure 12:
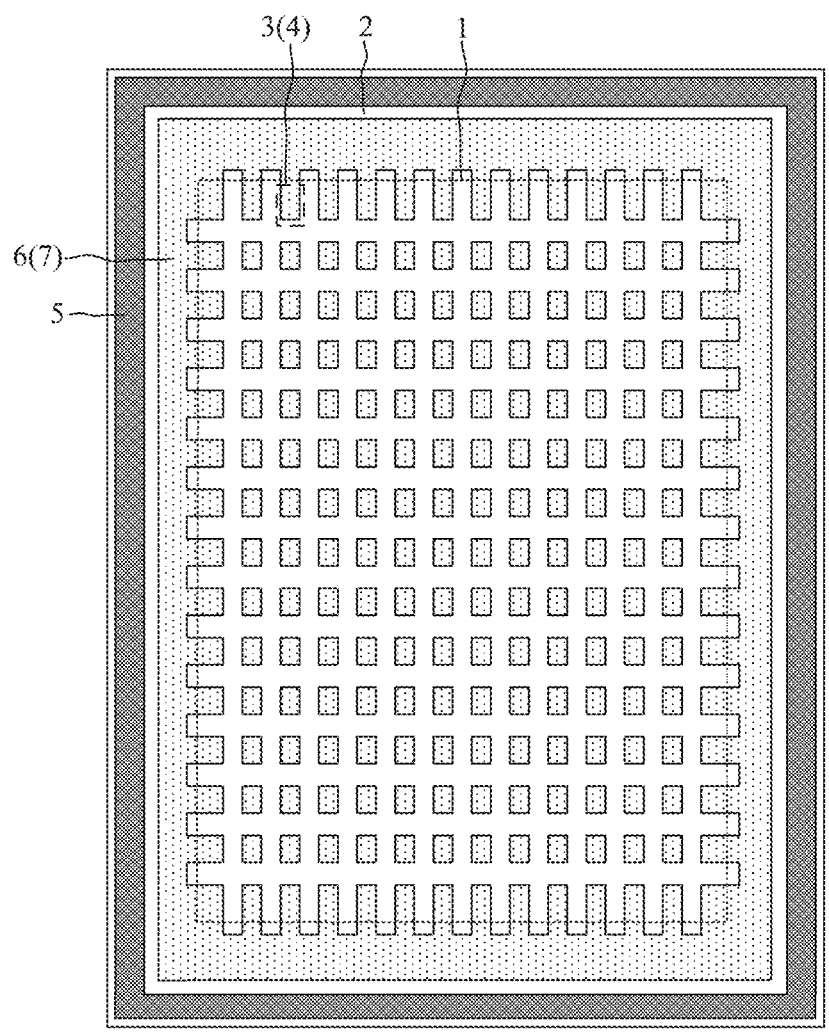
FIG. 12 is still another schematic structural diagram of a display panel according to an embodiment of the present disclosure.

In an implementation, FIG. 12 is still another schematic structural diagram of a display panel according to an embodiment of the present disclosure. As shown in FIG. 12, the second support structure 6 is in communication with its neighboring first support portion 4. In this case, the second support structure 6 overlaps with the edge of the display area 1, i.e., overlaps with an interface between the display area 1 and the bezel area 2. When laser sintering is performed on the encapsulation adhesive 5, the second support structure 6 can bear the pressure at the interface, which not only improves the cell thickness uniformity between the display area 1 and the bezel area 2 but also further reduces the risk of crushing the first support portions 4 near the interface.

Figure 13:
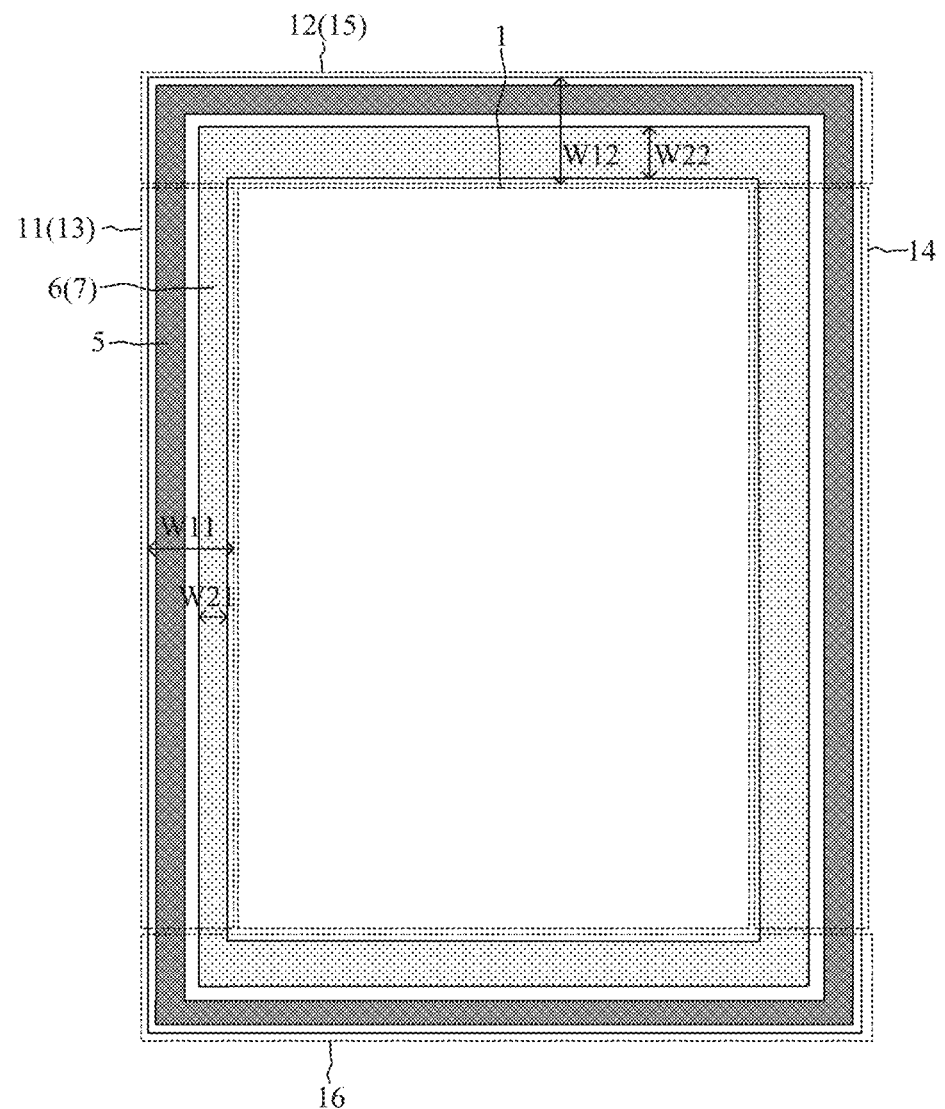
FIG. 13 is still another schematic structural diagram of a display panel according to an embodiment of the present disclosure.

In an implementation, FIG. 13 is still another schematic structural diagram of a display panel according to an embodiment of the present disclosure. As shown in FIG. 13, the bezel area 2 includes a first sub-area 11 and a second sub-area 12. The first sub-area 11 has a width W11 in a direction perpendicular to an extension direction thereof, the second sub-area 12 has a width W12 in a direction perpendicular to an extension direction thereof, and W11<W12. The second support structure 6 in the first sub-area 11 has a width W21 in a direction perpendicular to an extension direction thereof, the second support structure 6 in the second sub-area 12 has a width W22 in a direction perpendicular to an extension direction thereof, and W21<W22.

For the second sub-area 12 with a relatively large bezel width, the width of the second support structure 6 in the second sub-area 12 is increased, so that the width of the second support structure 6 in the second sub-area 12 better fits the bezel width of the second sub-area 12 while the second support structure 6 in the second sub-area 12 has a larger stressed area, thereby making the second support structures 6 in the second sub-area 12 and the first sub-area 11 have equal distances to the encapsulation adhesive 5.

Further, referring to FIG. 13 again, the first sub-area 11 and the second sub-area 12 extend along straight lines respectively.

For example, referring to FIG. 13 again, when the display panel is in a shape of a regular square, the bezel area 2 of the display panel includes four straight-line bezels: a left bezel 13, a right bezel 14, an upper bezel 15 and a lower bezel 16, wherein the left bezel 13 and the right bezel 14 are located on two opposite sides of the display area 1 in a row direction; the upper bezel 15 and the lower bezel 16 are located on two opposite sides of the display area 1 in a column direction. The first sub-area 11 and the second sub-area 12 may be any two of the left bezel 13, the right bezel 14, the upper bezel 15, and the lower bezel 16.

Figure 14:
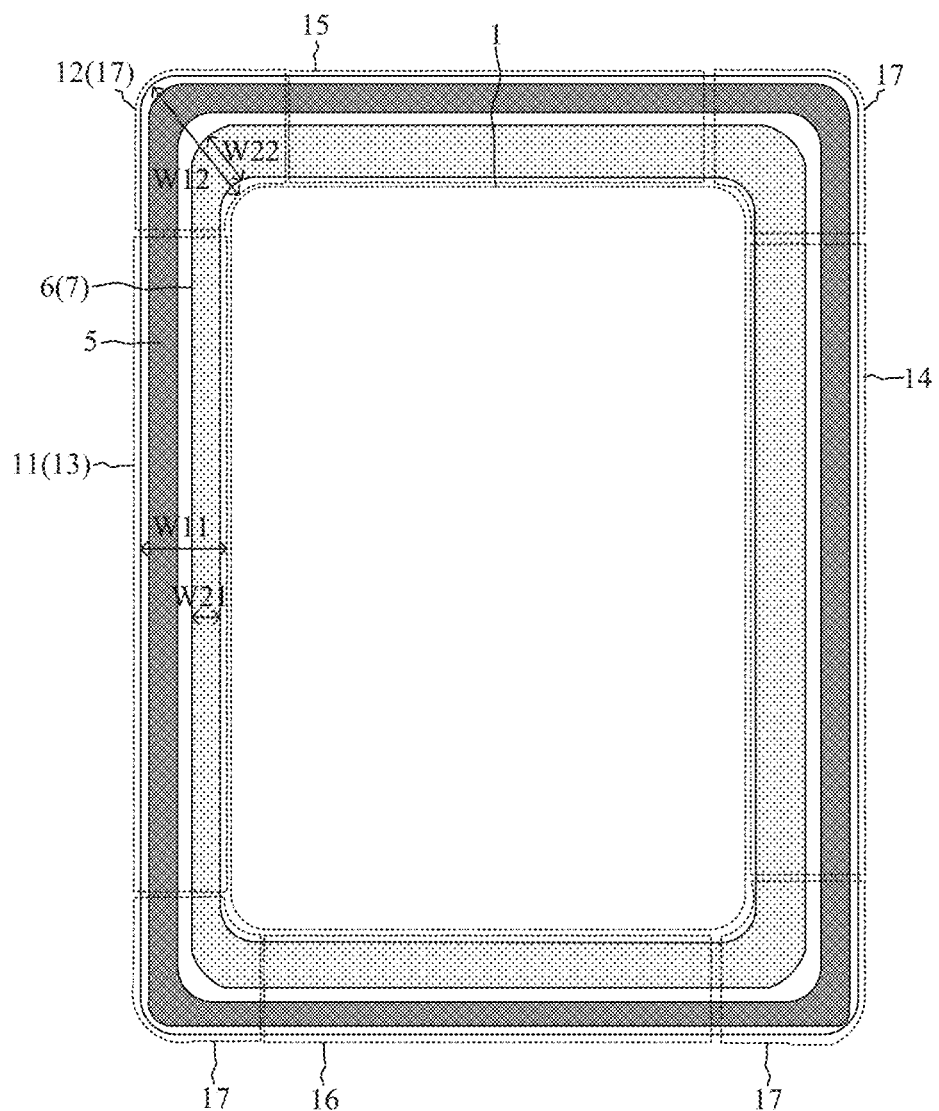
FIG. 14 is still another schematic structural diagram of a display panel according to an embodiment of the present disclosure.

Alternatively, FIG. 14 is still another schematic structural diagram of a display panel according to an embodiment of the present disclosure. As shown in FIG. 14, the second sub-area 12 extends along an arc, and the first sub-area 11 extends along a straight line.

At present, display panels in wearable display products are mostly in the shape of a square with rounded corners. Referring to FIG. 14 again, in addition to the left bezel 13, the right bezel 14, the upper bezel 15, and the lower bezel 16 that extend along straight lines, the bezel area 2 of the display panel further includes four corner bezels 17 that extend along arcs, wherein the four corner bezels 17 are in communication with the left bezel 13 and the right bezel 14, with the right bezel 14 and the upper bezel 15, with the upper bezel 15 and the lower bezel 16, and with the lower bezel 16 and the left bezel 13 respectively.

Compared with the four straight-line bezels, the corner bezels 17 have larger bezel widths. Accordingly, the second support structure 6 in the corner bezels 17 is provided with a larger width, so that the distance from the second support structure 6 in the corner bezels 17 to the encapsulation adhesive 5 is equal to the distance from the second support structure 6 in the four straight-line bezels to the encapsulation adhesive 5. The first sub-area 11 may be any one of the four corner bezels 17, and the second sub-area 12 may be any one of the left bezel 13, the right bezel 14, the upper bezel 15, and the lower bezel 16.

Figure 15:
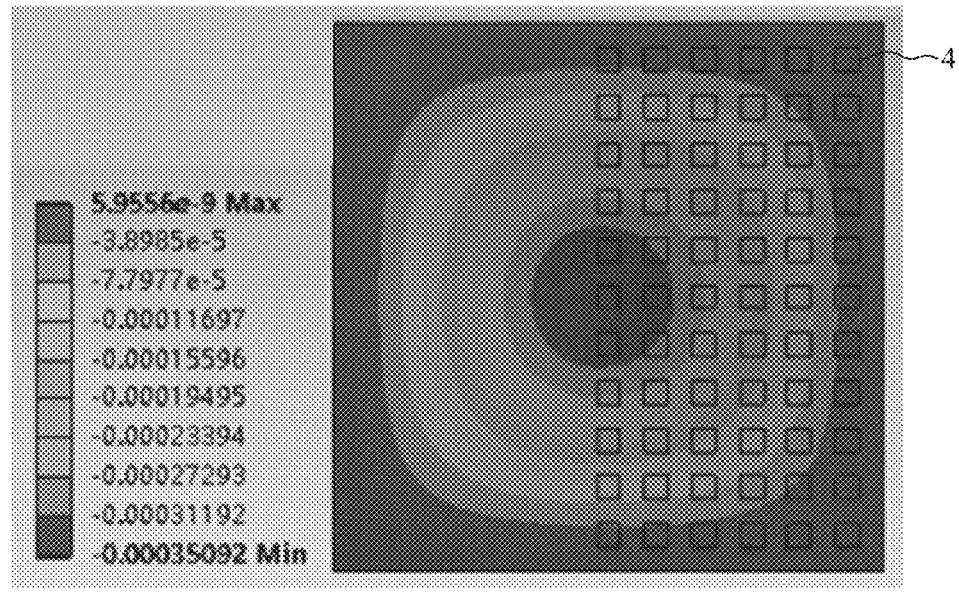
FIG. 15 is a test chart in a case that no second support structure is provided according to an embodiment of the present disclosure.
Figure 16:
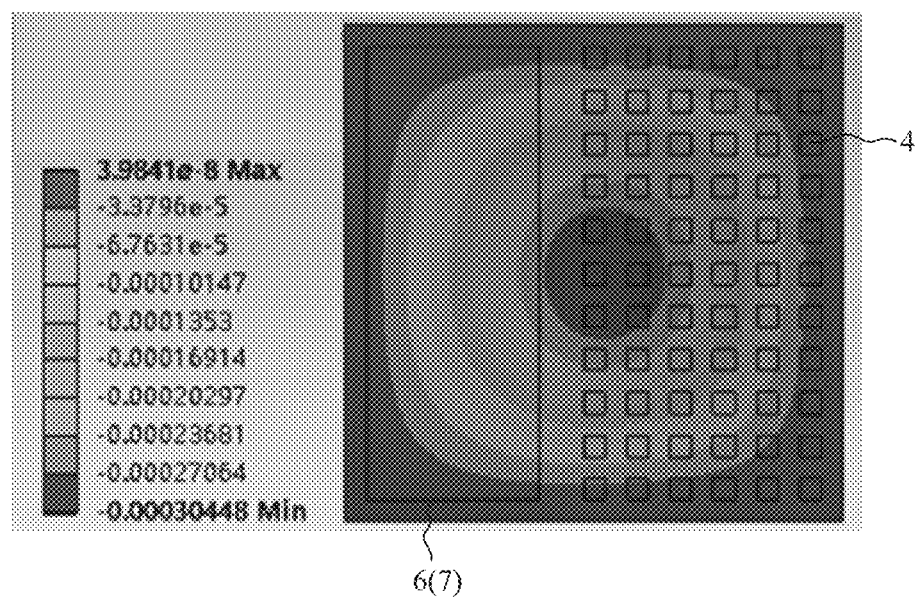
FIG. 16 is a test chart of a straight-line bezel according to an embodiment of the present disclosure.
Figure 17:
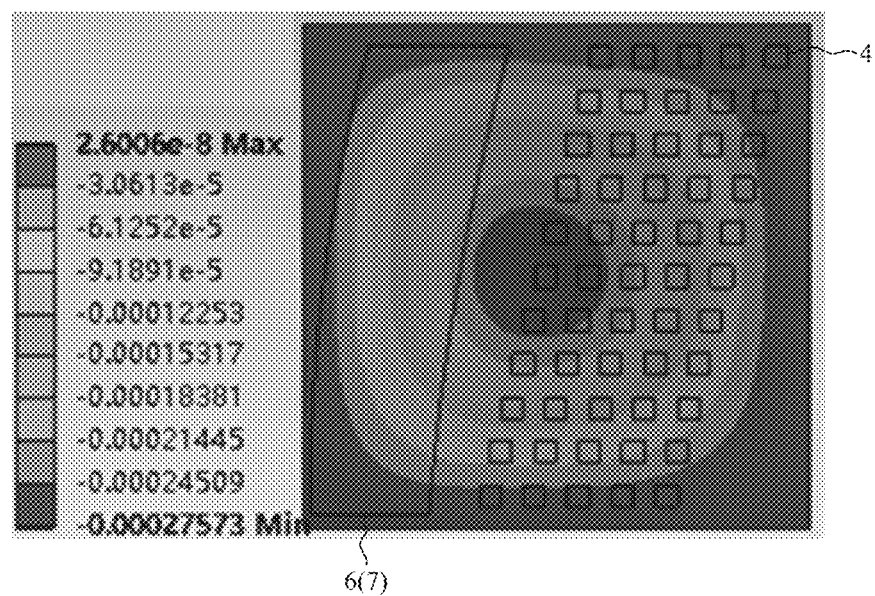
FIG. 17 is a test chart of a corner bezel according to an embodiment of the present disclosure.

Moreover, after the second support structure 6 in the corner bezels 17 is provided with a larger width, the second support structure 6 in the corner bezels 17 has a larger stressed area, thereby achieving higher support strength. FIG. 15 is a test chart in a case that no second support structure is provided according to an embodiment of the present disclosure; FIG. 16 is a test chart of a straight-line bezel according to an embodiment of the present disclosure; FIG. 17 is a test chart of a corner bezel according to an embodiment of the present disclosure. As shown in FIG. 15 to FIG. 17, values in the figures represent deformation resistances of corresponding areas, wherein a larger value of a deformation resistance indicates that the display panel is more easily deformed, and the cell thickness uniformity of the display panel is more easily affected.

Compared with FIG. 15, it can be learned from data in FIG. 16 that, after the second support structure 6 is disposed in the straight-line bezel, the deformation resistances corresponding to all the areas are reduced. For example, the minimum deformation resistance in FIG. 16 is −0.00030448, which is reduced by 13.23% compared with the minimum deformation resistance −0.00035092 in FIG. 15, indicating that the deformation resistance of the display panel is improved after the second support structure 6 is disposed in the straight-line bezel.

Compared with FIG. 15, it can be learned from data in FIG. 17 that, after the second support structure 6 is disposed in the corner bezel, the deformation resistances corresponding to all the areas are also reduced. For example, the minimum deformation resistance in FIG. 17 is −0.00027573, which is reduced by 21.43% compared with the minimum deformation resistance −0.00035092 in FIG. 15, indicating that the deformation resistance of the display panel is improved after the second support structure 6 is disposed in the corner bezel.

In addition, by comparing FIG. 16 with FIG. 17, it can be learned that the minimum deformation resistance in the corner bezel is lower than the minimum deformation resistance in the straight-line bezel, indicating that the deformation resistance of the display panel is improved after the second support structure 6 with a larger width is disposed in the corner bezel.

In an implementation, referring to FIG. 13 and FIG. 14 again, the second support structure 6 includes only one second support portion 7, and the second support portion 7 extends along the edge of the display area 1. In this case, the second support portion 7 has a large, stressed area, which can provide a stable support for all the positions of the bezel area 2, thereby further improving the cell thickness uniformity of the display panel.

Further, when the second support portion 7 continuously extends along the edge of the display area 1, to further improve the bearing capacity of the second support portion 7 so as to better bear the pressure caused by the encapsulation, referring to FIG. 11, in the direction perpendicular to the plane in which the display panel is located, orthographic projection of the second support portion 7 may cover an area between the encapsulation adhesive 5 and the display area 1, that is, the area between the display area 1 and the encapsulation adhesive 5 is completely filled with the second support portion 7.

Figure 18:
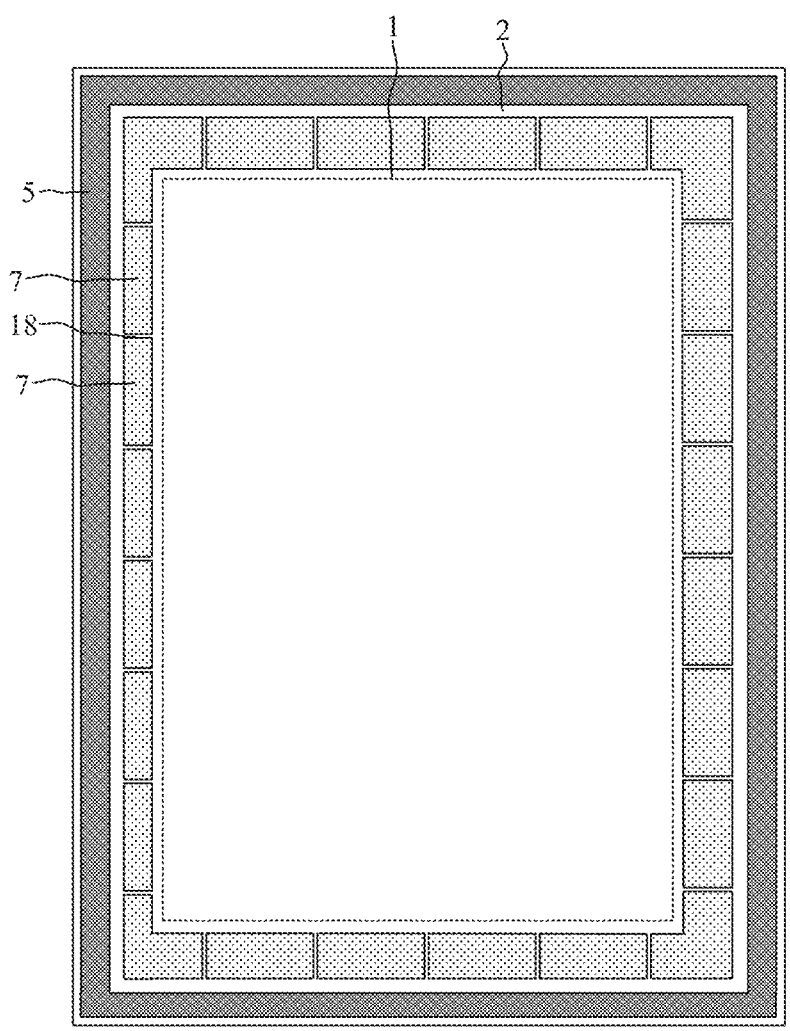
FIG. 18 is still another schematic structural diagram of a display panel according to an embodiment of the present disclosure.

In an implementation, FIG. 18 is still another schematic structural diagram of a display panel according to an embodiment of the present disclosure. As shown in FIG. 18, the second support structure 6 includes at least two second support portions 7, and a slit 18 is provided between every two adjacent second support portions 7.

The second support structure 6 is usually formed by an organic material. During the process of an organic film, some gas will remain inside the organic film. The gas will not only lead to uneven surface of the organic film, but also further penetrate the display area 1, to adversely affect the display functional devices in display area 1. In the embodiments of the present disclosure, by arranging a plurality of second support portions 7 at intervals, in the process of the second support structure 6, the gas in the organic film may be released by etching the slits 18, to prevent the residual gas in the organic film from affecting the film layer flatness of the second support portions 7 and prevent the residual gas in the organic film from affecting the device performance of the display functional devices.

Figure 19:
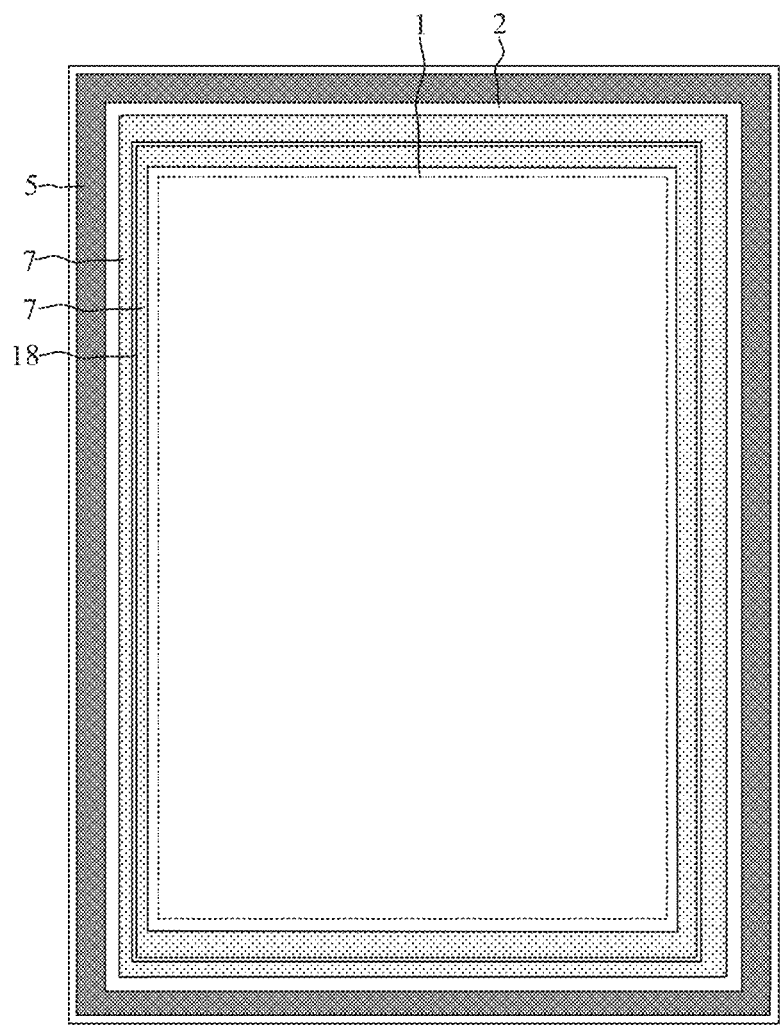
FIG. 19 is still another schematic structural diagram of a display panel according to an embodiment of the present disclosure.

FIG. 19 is still another schematic structural diagram of a display panel according to an embodiment of the present disclosure. As shown in FIG. 19, the slit 18 continuously extends along the edge of the display area 1.

On one hand, the second support portions 7 divided based on the slit 18 are structures that continuously extend along the edge of the display area 1; in this case, the second support structure 6 not only can provide a stable support for positions near the encapsulation adhesive 5 but also can provide a stable support for positions near the display area 1. On the other hand, the slit 18 is relatively long, and can release more gas in the organic film to reduce the residual gas.

Figure 20:
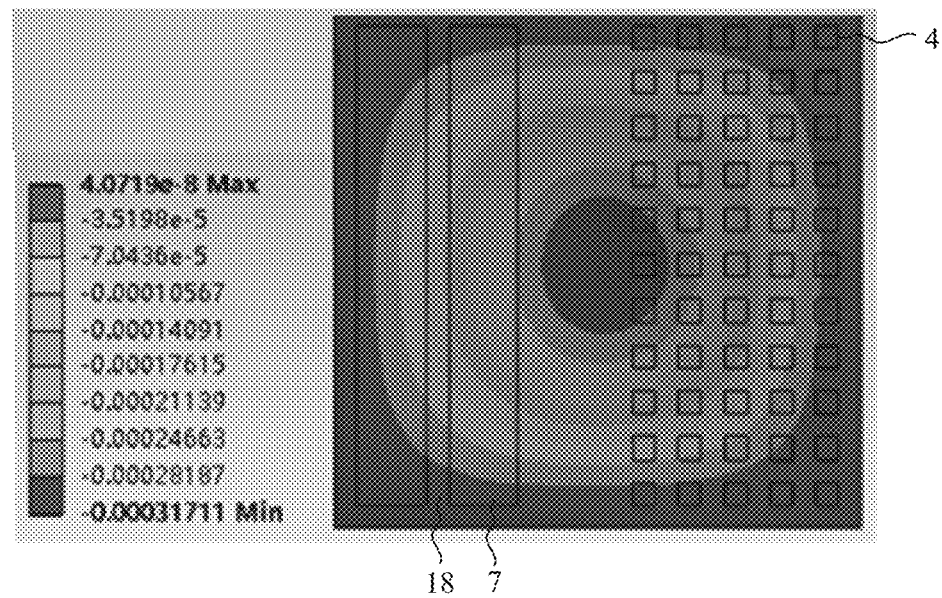
FIG. 20 is a test chart in a case that a slit in a second support structure continuously extends along an edge of a display area according to an embodiment of the present disclosure.

With reference to FIG. 15, as shown in FIG. 20, FIG. 20 is a test chart in a case that a slit in a second support structure continuously extends along an edge of a display area according to an embodiment of the present disclosure. Compared with FIG. 15, it can be learned from data shown in FIG. 20 that, deformation resistances corresponding to all the areas are also reduced after the second support structure 6 as shown in FIG. 19 is disposed. For example, the minimum deformation resistance in FIG. 20 is −0.00031711, which is reduced by 11.41% compared with the minimum deformation resistance −0.00035092 in FIG. 15, indicating that the deformation resistance of the display panel is improved after the second support structure 6 as shown in FIG. 19 is disposed in the bezel area 2.

Alternatively, referring to FIG. 18 again, an extension direction of the slit 18 intersects the extension direction of the edge of the display area 1. The slit 18 with such a structure is relatively short. When space for disposing the second support structure 6 is fixed, the coverage of the second support portion 7 can be increased accordingly, that is, the stressed area of the second support portion 7 is increased, thereby improving the support performance of the second support structure 6.

Figure 21:
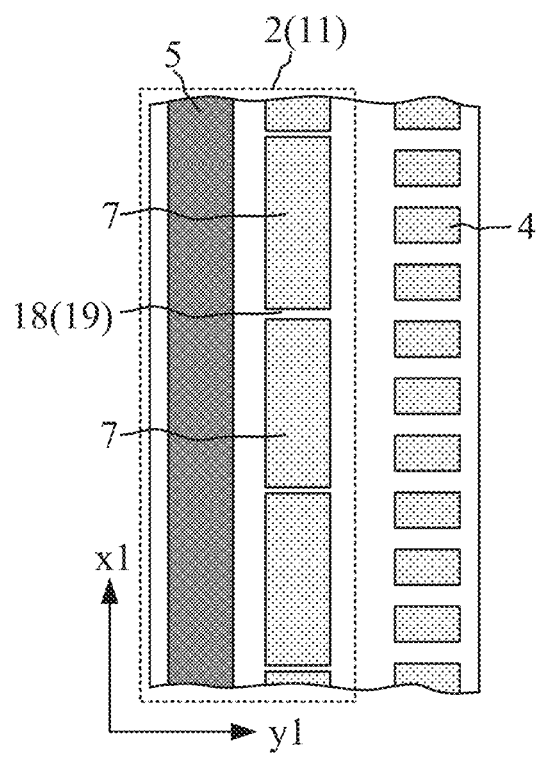
FIG. 21 is a schematic structural diagram of first slits according to an embodiment of the present disclosure.

Further, FIG. 21 is a schematic structural diagram of first slits according to an embodiment of the present disclosure. As shown in FIG. 21, the bezel area 2 includes a first sub-area 11, wherein the first sub-area 11 extends along a straight line. With reference to FIG. 13, the first sub-area 11 may be any one of the left bezel 13, the right bezel 14, the upper bezel 15, and the lower bezel 16. The first sub-area 11 includes at least two second support portions 7; in the first sub-area 11, the slit 18 between two adjacent second support portions 7 is a first slit 19. To further reduce an extension length of the first slit 19 to increase the stressed area of the second support portion 7, an extension direction y1 of the first slit 19 is made perpendicular to an extension direction x1 of the first sub-area 11.

Figure 22:
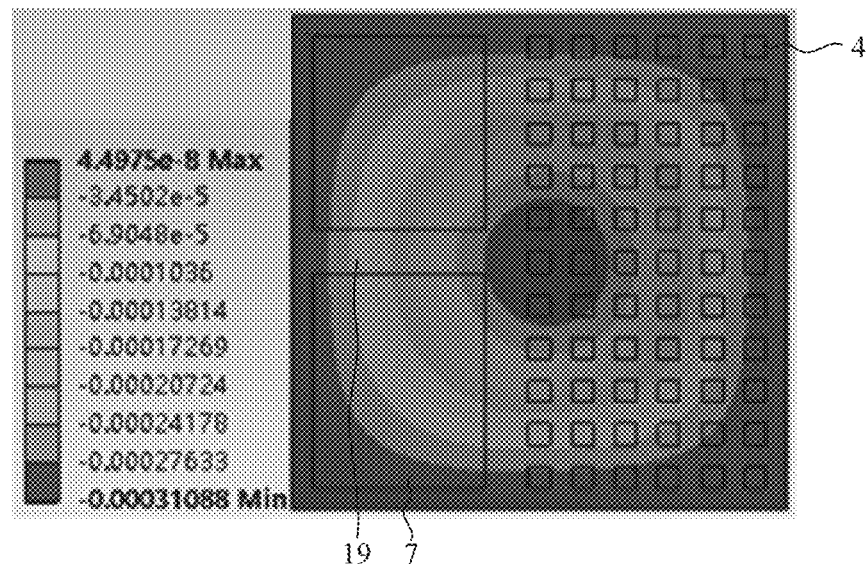
FIG. 22 is another test chart of a straight-line bezel according to an embodiment of the present disclosure.

With reference to FIG. 15, as shown in FIG. 22, FIG. 22 is another test chart of a straight-line bezel according to an embodiment of the present disclosure. Compared with FIG. 15, it can be learned from data shown in FIG. 22 that, deformation resistances corresponding to all the areas are reduced after the second support structure 6 as shown in FIG. 21 is disposed in the straight-line bezel. For example, the minimum deformation resistance in FIG. 22 is −0.00031088, which is reduced by 9.63% compared with the minimum deformation resistance −0.00035092 in FIG. 15, indicating that the deformation resistance of the display panel is improved after the foregoing support structure is disposed in the straight-line bezel.

Figure 23:
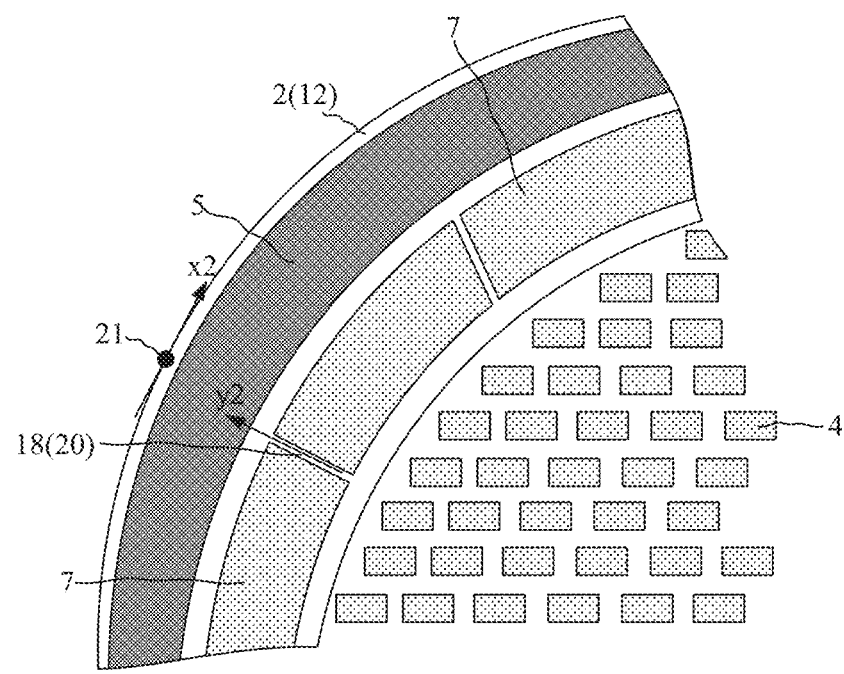
FIG. 23 is a schematic structural diagram of second slits according to an embodiment of the present disclosure.

Alternatively, FIG. 23 is a schematic structural diagram of second slits according to an embodiment of the present disclosure. As shown in FIG. 23, the bezel area 2 includes a second sub-area 12, wherein the second sub-area 12 extends along an arc. With reference to FIG. 14, the second sub-area 12 may be any one of the four corner bezels 17. The second sub-area 12 includes at least two second support portions 7. In the second sub-area 12, the slit 18 between two adjacent second support portions 7 is a second slit 20. To further reduce an extension length of the second slit 20 so as to increase the stressed area of the second support portion 7, an intersection between an extended line of the second slit 20 and an edge of the second sub-area 12 is set to be a first intersection 21, and an extension direction y2 of the second slit 20 is made perpendicular to a tangent direction x2 of the edge of the second sub-area 12 at the first intersection 21.

Figure 24:
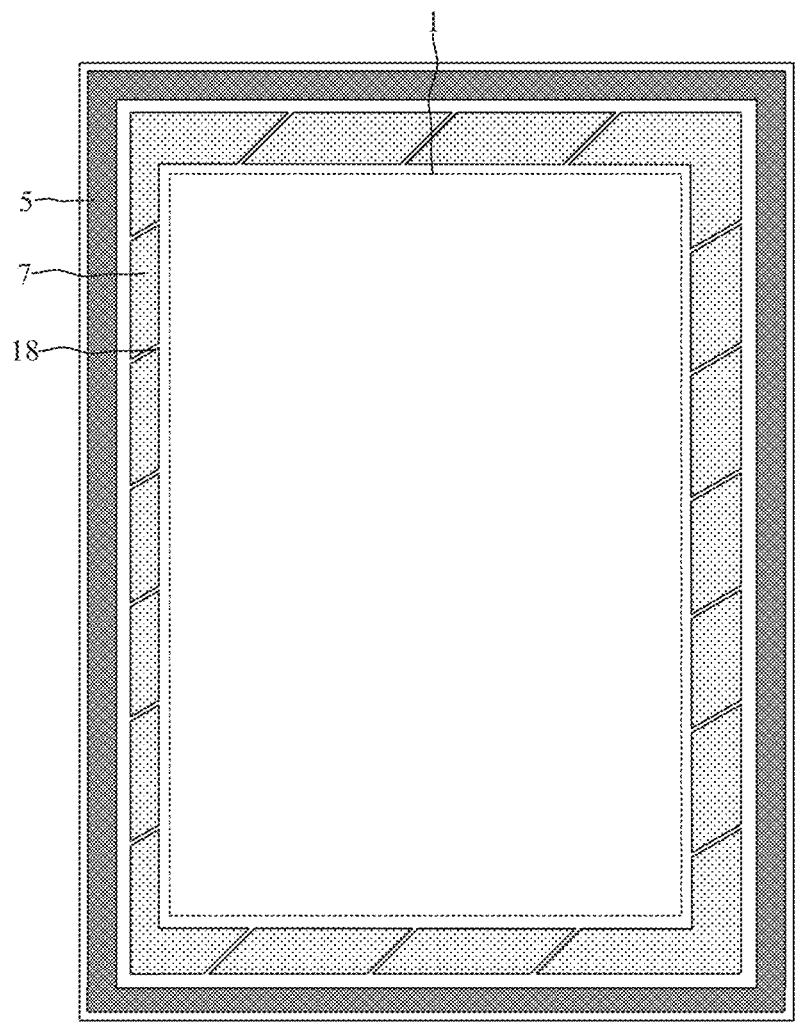
FIG. 24 is another schematic structural diagram of slits according to an embodiment of the present disclosure.

It should be noted that, in other optional embodiments of the present disclosure, the slit 18 may also extend in other manners. For example, the slit 18 may extend diagonally as shown in FIG. 24, or extend in any other irregular direction. However, it should be noted that, compared with other extension manners, by setting the extension direction of the slit 18 to be perpendicular to the extension direction of the bezel where it is located or to be perpendicular to the tangent direction, at the first intersection 21, of the edge of the bezel where it is located, the display panel can achieve a better deformation resistance.

Figure 25:
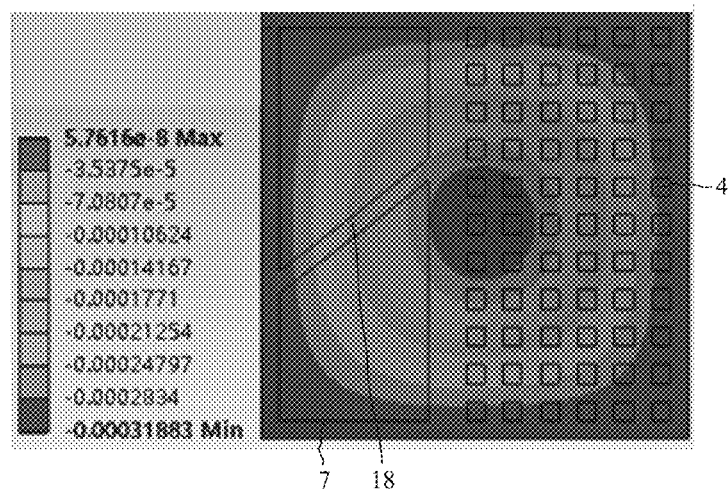
FIG. 25 is further another test chart of a straight-line bezel according to an embodiment of the present disclosure.

With reference to FIG. 15 and FIG. 22, as shown in FIG. 25, FIG. 25 is a test chart in a case that slits extend diagonally according to an embodiment of the present disclosure. Compared with FIG. 15, it can be learned from data shown in FIG. 25 that, deformation resistances corresponding to all the areas are reduced after the second support structure 6 as shown in FIG. 24 is disposed in the bezel area 2. For example, the minimum deformation resistance in FIG. 25 is −0.00031883, which is reduced by 9.14% compared with the minimum deformation resistance −0.00035092 in FIG. 15, indicating that the deformation resistance of the display panel is improved after the second support structure 6 is disposed. However, compared with FIG. 22, the deformation resistances in FIG. 25 are reduced by a smaller degree, indicating that when the slits 18 extend diagonally, the deformation resistance of the display panel is slightly lower than that of the display panel in which the slits 18 extend along an extension direction perpendicular to the bezel where it is located.

Figure 26:
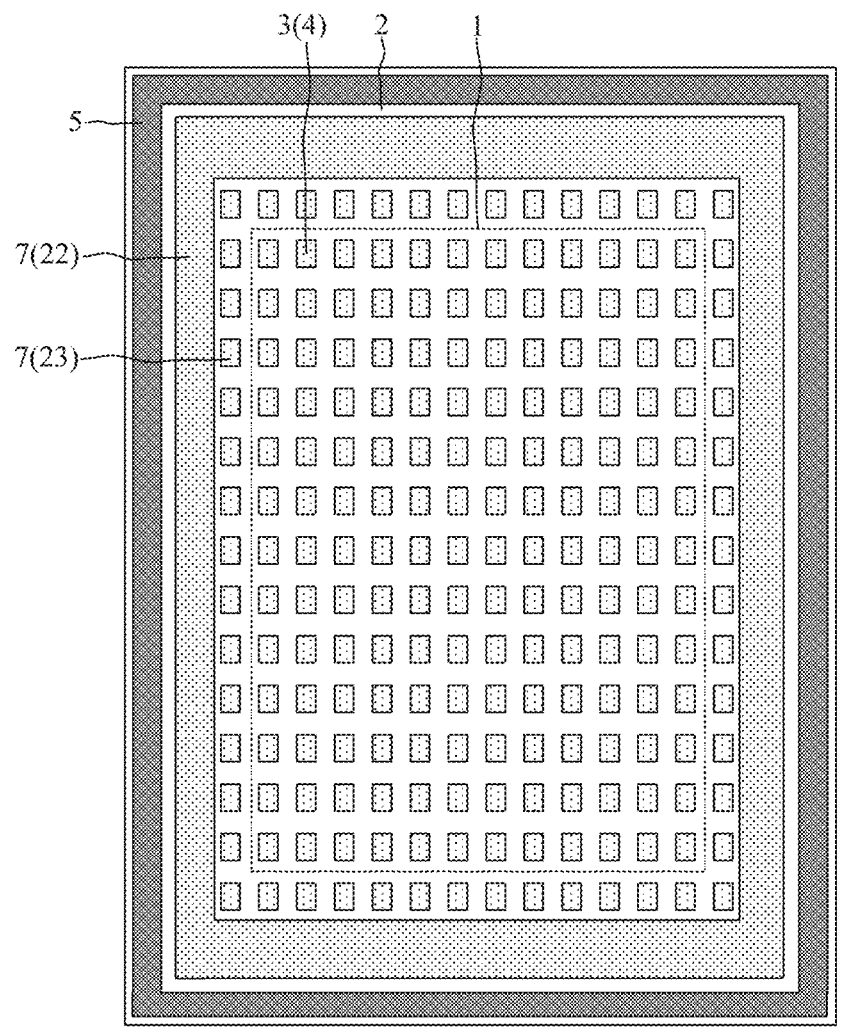
FIG. 26 is still another schematic structural diagram of a display panel according to an embodiment of the present disclosure.

In an implementation, FIG. 26 is still another schematic structural diagram of a display panel according to an embodiment of the present disclosure. As shown in FIG. 26, the second support structure 6 includes a plurality of second support portions 7, wherein the second support portions 7 include a $1^{st}$ second support portion 22 and a $2^{nd}$ second support portion 23, and the $1^{st}$ second support portion 22 is located on a side of the $2^{nd}$ second support portion 23 that is away from the display area 1. Moreover, in the direction perpendicular to the plane in which the display panel is located, orthographic projection area of the $1^{st}$ second support portion 22 is larger than orthographic projection area of the $2^{nd}$ second support portion 23.

In an optional implementation, in the direction perpendicular to the plane in which the display panel is located, the orthographic projection area of the $2^{nd}$ second support portion 23 is larger than the orthographic projection area of the $1^{st}$ second support portion 22, that is, design sizes of the $1^{st}$ second support portion 22 and the $2^{nd}$ second support portion 23 are both larger than the design size of the first support portion 4. Alternatively, in another possible implementation, the orthographic projection of the $2^{nd}$ second support portion 23 has an area equal to that of the orthographic projection of the $1^{st}$ second support portion $1^{st}$ second support portion 22, that is, the design size of the $2^{nd}$ second support portion 23 is the same as the design size of the first support portion 4, and only the design size of the $1^{st}$ second support portion 22 is larger than that of the first support portion 4.

When the second support portions 7 in the second support structure 6 are designed to have different sizes, by arranging the $1^{st}$ second support portion 22 with a larger size and higher bearing capacity to be closer to the encapsulation adhesive 5, the support strength of the second support structure 6 near the encapsulation adhesive 5 can be better improved, to bear the pressure near the encapsulation adhesive 5, thereby further reducing the risk of crushing the second support structure 6.

In an implementation, the display panel provided in the embodiments of the present disclosure may be an organic light-emitting diode (OLED) display panel.

Figure 27:
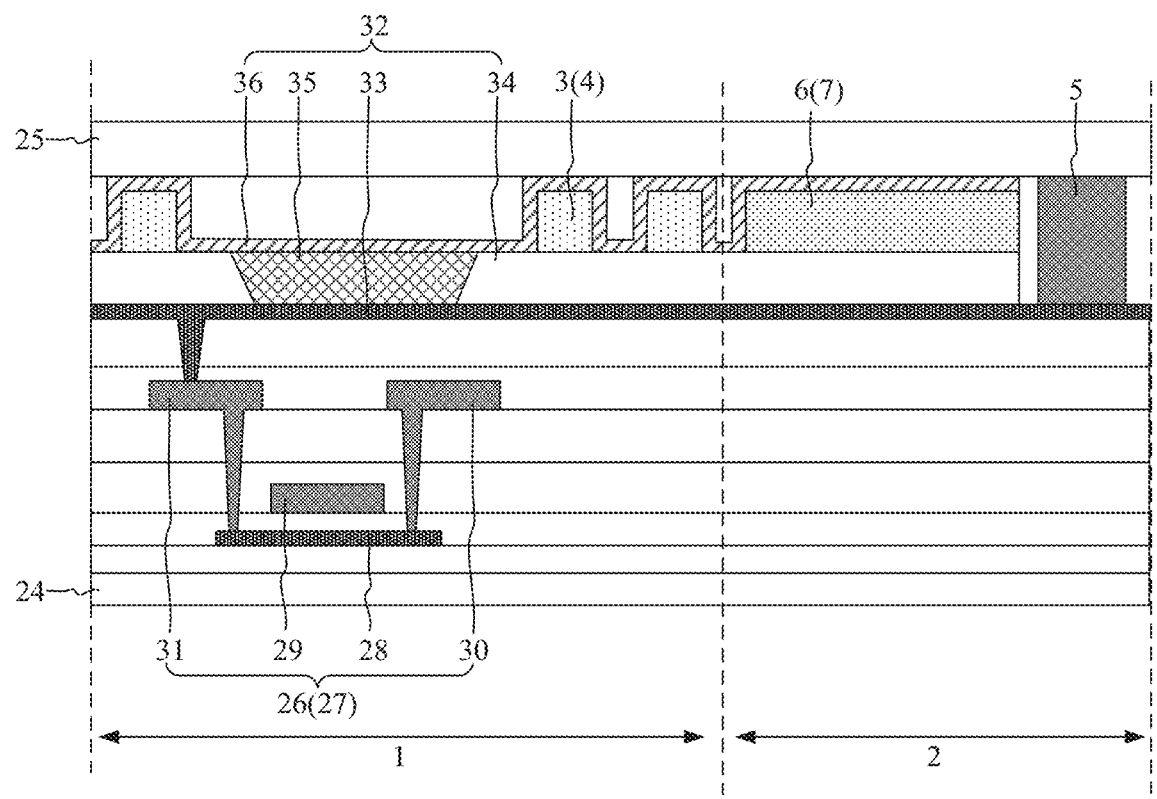
FIG. 27 is cross-sectional view of a display panel according to an embodiment of the present disclosure.

FIG. 27 is cross-sectional view of a display panel according to an embodiment of the present disclosure. As shown in FIG. 27, when the display panel is an OLED display panel, the display panel further includes: an array substrate 24 and a cell-assembled substrate 25 that are disposed opposite to each other, wherein the array substrate 24 is the first substrate 10 mentioned above, the cell-assembled substrate 25 is the second substrate 9 mentioned above, and the cell-assembled substrate 25 specifically may be a glass cover plate; a circuit layer 26 located in the array substrate 24, wherein the circuit layer includes a plurality of transistors 27, and each transistor includes an active layer 28, a gate 29 located on a side of the active layer 28 that faces towards the cell-assembled substrate 25, and a source 30 and a drain 31 that are located on a side of the gate 29 which faces towards the cell-assembled substrate 25; and a light-emitting device layer 32 located in the array substrate 24, wherein the light-emitting device layer 32 is located on a side of the circuit layer that faces towards the cell-assembled substrate 25.

The light-emitting device layer 32 includes: an anode layer 33; a pixel definition layer 34 located on a side of the anode layer 33 that faces away from the circuit layer, wherein the pixel definition layer 34 includes an opening, and at least a part of the anode layer 33 is exposed in the opening; and a light-emitting layer 35 located in the opening. The first support structure 3 and the second support structure 6 are located on a side of the pixel definition layer 34 that faces away from the pixel definition layer 34.

In the foregoing structure, in addition to providing a stable support for the cell-assembled substrate 25, the first support structure 3 and the second support structure 6 are further used for supporting a mask plate that forms the light-emitting layer 35 in the process of the display panel. When the second support structure 6 provided by the embodiments of the present disclosure is used, the second support structure 6 with higher support stability can provide a stable support for the mask plate, thereby further improving the process precision of the light-emitting layer 35.

In addition, the light-emitting device layer 32 further includes a cathode layer 36, wherein the cathode layer 36 is located on a side of the first support structure 3 and the second support structure 6 that faces away from the pixel definition layer 34. In the direction perpendicular to the plane in which the display panel is located, the orthographic projection of the cathode layer 36 covers the display area 1.

In addition, it should be further noted that, in the direction perpendicular to the plane in which the display panel is located, the orthographic projection of the first support structure 3 does not overlap with the orthographic projection of the light-emitting layer 35, to prevent the first support structure 3 from shielding light emitted from the light-emitting layer 35.

Alternatively, the display panel provided by the embodiments of the present disclosure may be a liquid crystal display (LCD) display panel.

Figure 28:
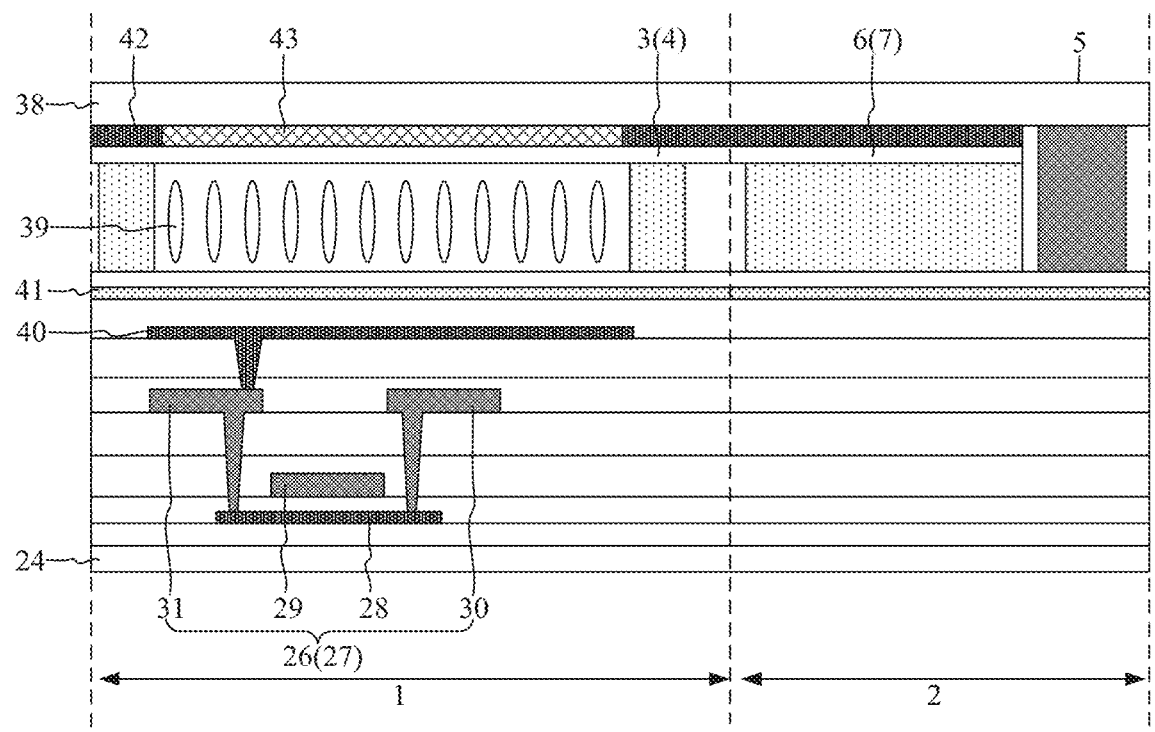
FIG. 28 is another cross-sectional view of a display panel according to an embodiment of the present disclosure.

FIG. 28 is another cross-sectional view of a display panel according to an embodiment of the present disclosure. As shown in FIG. 28, when the display panel is a LCD display panel, the display panel further includes: an array substrate 24 and a color filter substrate 38 that are disposed opposite to each other, wherein the array substrate 24 is the first substrate 10 mentioned above, and the color filter substrate 38 is the second substrate 9 mentioned above; and a liquid crystal layer 39 located between the array substrate 24 and the color filter substrate 38. The first support structure 3 and the second support structure 6 are located between the array substrate 24 and the color filter substrate 38.

It should be noted that, the display panel further includes a circuit layer 26 located in the array substrate 24, wherein the circuit layer includes a plurality of transistors 27, and each transistor includes an active layer 28, a gate 29 located on a side of the active layer 28 that faces towards the cell-assembled substrate 25, and a source 30 and a drain 31 that are located on a side of the gate 29 which faces towards the cell-assembled substrate 25.

In addition, the display panel further includes a pixel electrode 40 and a common electrode 41 that are located on a side of the circuit layer which faces towards the color filter substrate 38. The circuit layer 26 is configured to provide a driving current to the pixel electrode 40, so that liquid crystal molecules in the liquid crystal layer 39 rotate under the effect of an electrical field formed by the pixel electrode 40 and the common electrode 41, thereby displaying a picture.

In addition, it should be further noted that, a black matrix 42 and a color photoresist 43 may be arranged on a side of the color filter substrate 38, the color photoresist 43 is used for converting white light into color light, and the black matrix 42 is used for limiting a light-emitting area of the display panel. To prevent the first support structure 3 from shielding light emitted by the display panel, in the direction perpendicular to the plane in which the display panel is located, the orthographic projection of the first support structure 3 is located within the orthographic projection of the black matrix 42.

Figure 29:
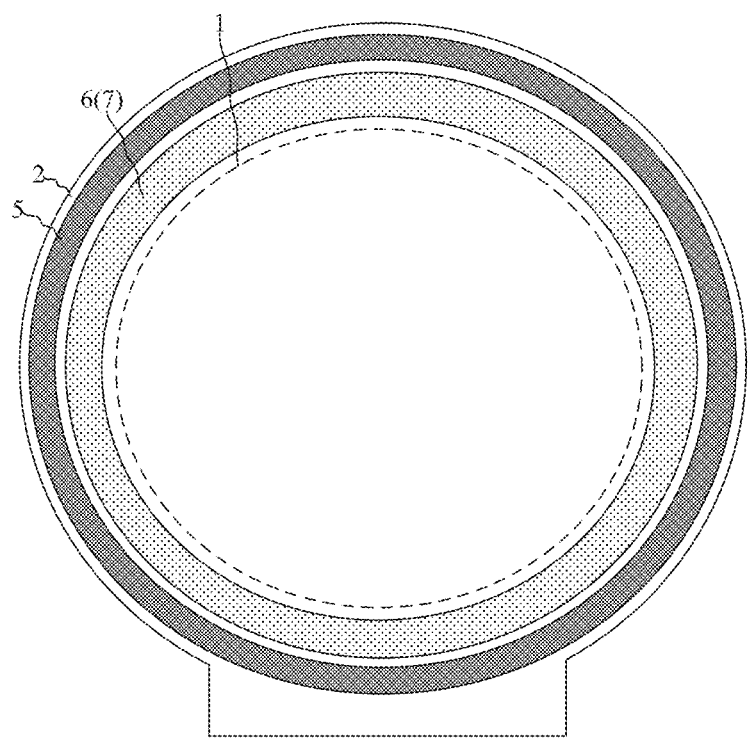
FIG. 29 is still another schematic structural diagram of a display panel according to an embodiment of the present disclosure.

In addition, it should be emphasized that the technical solutions provided by the embodiments of the present disclosure can be applied to display products of any shapes. For example, referring to FIG. 13 and FIG. 14, the technical solutions can be applied to a display product having a display panel in a shape of a rectangle or a rectangle with rounded corners, such as a mobile phone or a watch. Alternatively, FIG. 29 is still another schematic structural diagram of a display panel according to an embodiment of the present disclosure; as shown in FIG. 29, the technical solutions can further be applied to a special-shaped display product having a display panel in a shape of a circle or an oval. For display panels in whichever shapes, after the application of the technical solutions provided by the embodiments of the present disclosure, the stress uniformity of the support structures in the bezel area 2 can be effectively improved.

Figure 30:
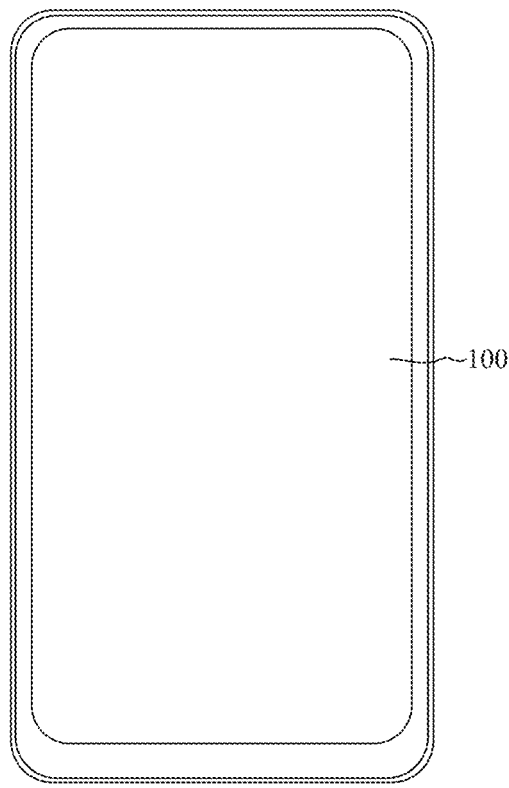
FIG. 30 is a schematic structural diagram of a display apparatus according to an embodiment of the present disclosure.

Based on the same inventive concept, the embodiments of the present disclosure further provide a display apparatus. FIG. 30 is a schematic structural diagram of a display apparatus according to an embodiment of the present disclosure. As shown in FIG. 30, the display apparatus includes the foregoing display panel 100, wherein the specific structure of the display panel 100 as described in detail in the foregoing embodiments, and details are not described herein again. Certainly, the display apparatus shown in FIG. 30 is for schematic description only. The display apparatus may be any electronic device with a display function, such as a mobile phone, a tablet computer, a notebook computer, an ebook, or a television.

The above descriptions are merely preferred embodiments of the present disclosure, and are not intended to limit the present disclosure. Any modifications, equivalent replacements, improvements, and the like made within the spirit and principle of the present disclosure shall fall within the protection scope of the present disclosure.

Finally, it should be noted that the above embodiments are merely intended to describe the technical solutions of the present disclosure, rather than to limit the present disclosure. Although the present disclosure is described in detail with reference to the above embodiments, persons of ordinary skill in the art should understand that they may still make modifications to the technical solutions described in the above embodiments or make equivalent replacements to some or all technical features thereof, without departing from the essence of the technical solutions in the embodiments of the present disclosure.

What is claimed is:

1. A display panel, having a display area and a bezel area, and comprising:
    a first support structure located in the display area and comprising a plurality of first support portions;
    an encapsulation adhesive located in the bezel area and extending along an edge of the display area; and
    a second support structure located in the bezel area and extending along the edge of the display area, and located on a side of the encapsulation adhesive that faces towards the display area;
    wherein at different positions of the bezel area, the second support structure and the encapsulation adhesive are at an equal distance from each other within a preset error range; the second support structure comprises at least one second support portion; and
    in a direction perpendicular to a plane in which the display panel is located, an orthographic projection area of each of the at least one second support portion is larger than an orthographic projection area of a first support portion of the plurality of first support portions;
    the bezel area comprises a first sub-area and a second sub-area, the first sub-area has a width W11 in a direction perpendicular to an extension direction of the first sub-area, the second sub-area has a width W12 in a direction perpendicular to an extension direction of the second sub-area, and W11<W12; and
    the second support structure in the first sub-area has a width W21 in a direction perpendicular to an extension direction of the second support structure in the first sub-area, the second support structure in the second sub-area has a width W22 in a direction perpendicular to an extension direction of the second support structure in the second sub-area, and W21<W22;
    wherein the display panel is an organic light-emitting diode display panel; and
    wherein the second support structure is in contact with the first support structure adjacent to the second support structure to form a third support structure, the third support structure extends along the edge of the display area, and comprises adjacent first sub-support structure and second sub-support structure, in a direction from the encapsulation adhesive towards the third support structure, a width of the first sub-support structure is greater than a width of the second sub-support structure.

2. The display panel according to claim 1, wherein the distance between the second support structure and the encapsulation adhesive is L, and L≤75 μm.

3. The display panel according to claim 1, wherein the second support structure is in contact with the encapsulation adhesive.

4. The display panel according to claim 1, wherein, at different positions of the bezel area, an orthographic projection of the second support structure in the direction perpendicular to the plane in which the display panel is located and the display area are at an equal distance from each other within a preset error range.

5. The display panel according to claim 4, wherein in the direction perpendicular to the plane in which the display panel is located, an edge of the orthographic projection of the second support structure coincides with the edge of the display area.

6. The display panel according to claim 1, wherein the first sub-area and the second sub-area each extend along a straight line.

7. The display panel according to claim 1, wherein the first sub-area extends along a straight line, and the second sub-area extends along an arc.

8. The display panel according to claim 1, wherein the second support structure comprises only one second support portion, and the second support portion continuously extends along the edge of the display area.

9. The display panel according to claim 8, wherein in the direction perpendicular to the plane in which the display panel is located, the orthographic projection of the second support portion covers an area between the encapsulation adhesive and the display area.

10. The display panel according to claim 1, wherein the second support structure comprises at least two second support portions, and a slit is disposed between two adjacent second support portions of the at least two second support portions.

11. The display panel according to claim 1, wherein the slit continuously extends along the edge of the display area.

12. The display panel according to claim 1, wherein an extension direction of the slit intersects an extension direction of the edge of the display area.

13. The display panel according to claim 12, wherein the bezel area comprises a first sub-area, the first sub-area extends along a straight line, and the first sub-area is provided with at least two second support portions of the at least two second support portions; and
    in the first sub-area, the slit between two adjacent second support portions of the at least two second support portions is a first slit, and an extension direction of the first slit is perpendicular to an extension direction of the first sub-area.

14. The display panel according to claim 12, wherein
the bezel area comprises a second sub-area, the second sub-area extends along an arc, and the second sub-area is provided with at least two second support portions of the at least two second support portions; and
in the second sub-area, the slit between two adjacent second support portions of the at least two second support portions is a second slit, an intersection between an extended line of the second slit and an edge of the second sub-area is a first intersection, and an extension direction of the second slit is perpendicular to a tangent direction of the edge of the second sub-area at the first intersection.

15. The display panel according to claim 1, wherein
the second support structure comprises a plurality of second support portions, and the plurality of second support portions comprises a $1^{st}$ second support portion and a $2^{nd}$ second support portion, wherein the $1^{st}$ second support portion is located on a side of the $2^{nd}$ second support portion that is away from the display area; and
in the direction perpendicular to the plane in which the display panel is located, an orthographic projection area of the $1^{st}$ second support portion is larger than an orthographic projection area of the $2^{nd}$ second support portion.

16. The display panel according to claim 1, further comprising:
an array substrate and a cell-assembled substrate that are disposed opposite to each other;
a circuit layer located in the array substrate; and
a light-emitting device layer located in the array substrate and located on a side of the circuit layer that faces towards the cell-assembled substrate,
wherein the light-emitting device layer comprises:
an anode layer;
a pixel definition layer located on a side of the anode layer that faces away from the circuit layer, the pixel definition layer comprising an opening, and at least part of the anode layer being exposed to the opening; and
a light-emitting layer located in the opening;
wherein the first support structure and the second support structure are located on a side of the pixel definition layer that faces away from the pixel definition layer.

17. The display panel according to claim 1, further comprising:
an array substrate and a color filter substrate that are disposed opposite to each other; and
a liquid crystal layer located between the array substrate and the color filter substrate;
wherein each of the first support structure and the second support structure is located between the array substrate and the color filter substrate.

18. A display apparatus, comprising a display panel, wherein
the display panel, has a display area and a bezel area, and comprises:
a first support structure located in the display area and comprising a plurality of first support portions;
an encapsulation adhesive located in the bezel area and extending along an edge of the display area; and
a second support structure located in the bezel area and extending along the edge of the display area, and located on a side of the encapsulation adhesive that faces towards the display area;
wherein, at different positions of the bezel area, the second support structure and the encapsulation adhesive are at an equal distance from each other within a preset error range; the second support structure comprises at least one second support portion; and, in a direction perpendicular to a plane in which the display panel is located, an orthographic projection area of each of the at least one second support portion is larger than an orthographic projection area of one of the plurality of first support portions;
the bezel area comprises a first sub-area and a second sub-area, the first sub-area has a width W11 in a direction perpendicular to an extension direction of the first sub-area, the second sub-area has a width W12 in a direction perpendicular to an extension direction of the second sub-area, and W11<W12; and
the second support structure in the first sub-area has a width W21 in a direction perpendicular to an extension direction of the second support structure in the first sub-area, the second support structure in the second sub-area has a width W22 in a direction perpendicular to an extension direction of the second support structure in the second sub-area, and W21<W22;
wherein the display panel is an organic light-emitting diode display panel; and
wherein the second support structure is in contact with the first support structure adjacent to the second support structure to form a third support structure, the third support structure extends along the edge of the display area, and comprises adjacent first sub-support structure and second sub-support structure, in a direction from the encapsulation adhesive towards the third support structure, a width of the first sub-support structure is greater than a width of the second sub-support structure.

* * * * *